(12) United States Patent
Young et al.

(10) Patent No.: US 12,310,056 B2
(45) Date of Patent: May 20, 2025

(54) METHOD OF FORMING SEMICONDUCTOR DEVICE

(71) Applicant: Taiwan Semiconductor Manufacturing Company, Ltd., Hsinchu (TW)

(72) Inventors: Bo-Feng Young, Taipei (TW); Sai-Hooi Yeong, Hsinchu County (TW); Chi-On Chui, Hsinchu (TW); Chien-Ning Yao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 133 days.

(21) Appl. No.: 17/873,175

(22) Filed: Jul. 26, 2022

(65) Prior Publication Data

US 2022/0359765 A1    Nov. 10, 2022

Related U.S. Application Data

(63) Continuation of application No. 16/745,340, filed on Jan. 17, 2020, now Pat. No. 11,444,202.

(51) Int. Cl.
*H10D 30/67*  (2025.01)
*H01L 21/02*  (2006.01)
*H10D 30/01*  (2025.01)
*H10D 62/10*  (2025.01)
*H10D 64/01*  (2025.01)

(52) U.S. Cl.
CPC ... *H10D 30/6713* (2025.01); *H01L 21/02532* (2013.01); *H01L 21/02603* (2013.01); *H10D 30/031* (2025.01); *H10D 30/6735* (2025.01); *H10D 30/6757* (2025.01); *H10D 62/121* (2025.01); *H10D 64/017* (2025.01)

(58) Field of Classification Search
CPC .......... H01L 21/02603; H01L 29/0673; H01L 29/42392; H01L 29/66545
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

(Continued)

*Primary Examiner* — Brian Turner
(74) *Attorney, Agent, or Firm* — JCIPRNET

(57) ABSTRACT

Provided are a semiconductor device and a method of forming the same. The semiconductor device includes a substrate, a plurality of semiconductor nanosheets, a source/drain (S/D) region, a gate stack, and a liner layer. The substrate includes at least one fin. The plurality of semiconductor nanosheets are stacked on the at least one fin. The S/D region abuts the plurality of semiconductor nanosheets. The gate stack wraps the plurality of semiconductor nanosheets. The liner layer lines a bottom surface and a sidewall of the S/D region and is sandwiched between the S/D region and the gate stack.

20 Claims, 41 Drawing Sheets

(56) References Cited

U.S. PATENT DOCUMENTS

2002/0164841 A1* 11/2002 Assaderaghi ..... H01L 29/66757
                                                        438/149
2016/0351580 A1* 12/2016 Hopkins ............. H01L 29/7883
2019/0148489 A1*  5/2019 Bhuwalka ........... H01L 29/0665
                                                        257/365
2019/0181225 A1*  6/2019 Lee ................... H01L 29/42392
2020/0381546 A1* 12/2020 Cho ................... H01L 29/66439
2021/0066477 A1*  3/2021 Lee ................... H01L 21/02236

* cited by examiner

METHOD OF FORMING SEMICONDUCTOR DEVICE

CROSS-REFERENCE TO RELATED APPLICATION

This application is a continuation application of and claims the priority benefit of a prior application Ser. No. 16/745,340, filed on Jan. 17, 2020, now allowed. The entirety of the above-mentioned patent application is hereby incorporated by reference herein and made a part of this specification.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, multi-gate devices have been introduced to replace planar transistors. However, there are quite a few challenges to be handled for the multi-gate technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
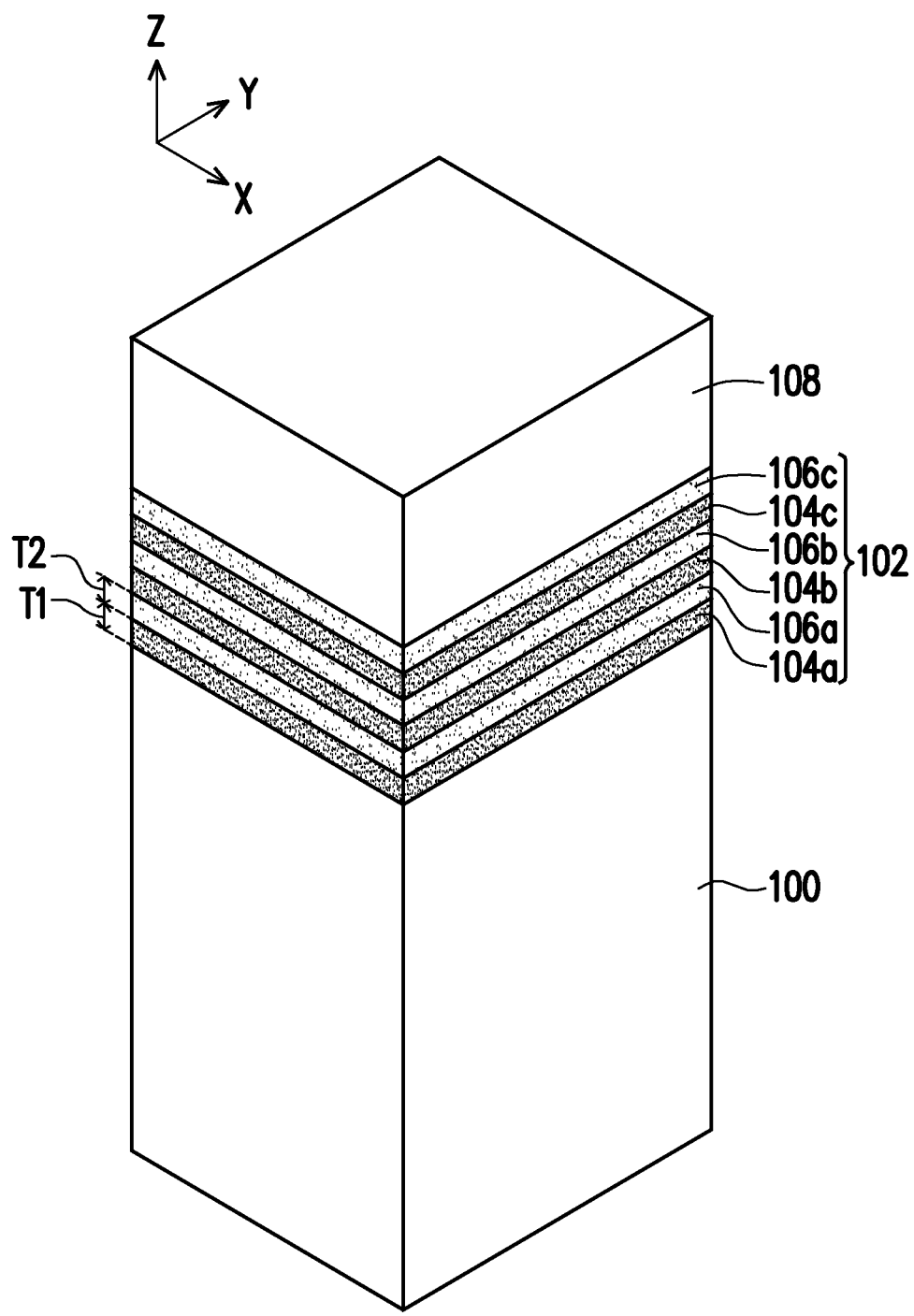
FIG. 1 to FIG. 12 are perspective views of intermediate stages in the formation of a semiconductor device in accordance with a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheets) or any number of channels. One of ordinary skill may recognize other examples of semiconductor devices that may benefit from aspects of the present disclosure.

In accordance with some embodiments, a liner layer is formed to line a bottom surface and a sidewall of the source/drain (S/D) region and sandwiched between the S/D region and the semiconductor nanosheets. The liner layer may provide a good interface for epitaxially growing the S/D region which is benefit to control the height and shape of the S/D region, thereby reducing void defects and retaining strain in the channels. In addition, the liner layer or a combination of the inner spacer and the liner layer connecting to each other may increase the etching resistance to protect the S/D region from damaging during the nanosheet formation.

FIG. 1 to FIG. 12 are perspective views of intermediate stages in the formation of a semiconductor device in accordance with a first embodiment of the disclosure. The semiconductor device illustrated in the following embodiments may be applied to, but not limited thereto, a fin field-effect transistor (FinFET), gate-all-around (GAA) FET, or other transistors including a multi-gate.

Referring to FIG. 1, a substrate 100 is provided. In some embodiments, the substrate 100 includes a crystalline silicon substrate (e.g., wafer). The substrate 100 may include various doped regions (e.g., p-type well and/or n-type well) depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some embodiments, an anti-punch-through (APT) implantation is performed on a top portion of the substrate 100 to form an APT region. The conductivity type of the dopants implanted in the APT region is the same as that of the doped regions (or wells). The APT region may extend under the subsequently formed source/drain (S/D) regions 140 (FIG. 8), and are used to reduce the leakage from the S/D regions 140 to substrate 100. For clarity, the doped regions and the APT region are not illustrated in FIG. 1 and subsequent drawings. In some alternative embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

As shown in FIG. 1, a semiconductor stack 102 is formed on the substrate 100. The semiconductor stack 102 may include a plurality of first layers 104a, 104b, 104c (collectively referred to as "first layers 104") and a plurality of second layers 106a, 106b, 106c (collectively referred to as "second layers 106") stacked alternately in a Z direction. Although only three first layers 104 and three second layers 106 are illustrated in FIG. 1, the embodiments of the present disclosure are not limited thereto. In other embodiments, the number of the first layers 104 and the second layers 106 are adjusted by the need, such as one first layer, two first layers, four first layers, or more first layers. The number of the second layers corresponds to the number of the first layers.

In some embodiments, the first layers 104 and the second layers 106 include different materials. For example, the first layers 104 are SiGe layers having a germanium percentage in the range between about 15 wt % and 40 wt %, and the second layers 106 are Si layers free from germanium. However, the embodiment of the disclosure is not limited thereto, in other embodiments, the first layers 104 and the second layers 106 have materials with different etching selectivities. In some embodiments, the first layers 104 and the second layers 106 are formed by an epitaxial growth process, such as a molecular beam epitaxy (MBE) process, a metalorganic chemical vapor deposition (MOCVD) process, or the like. In the case, the first layers 104 are epitaxial SiGe layers, and the second layers 106 are epitaxial Si layers. In some alternative embodiments, the first layers 104 and the second layers 106 are formed by a suitable deposition, such as chemical vapor deposition (CVD), atomic layer deposition (ALD), or the like. In the case, the first layers 104 are poly-SiGe layers, and the second layers 106 are poly-Si layers.

In some embodiments, the first layers 104 have the same thickness T1 and the second layers 106 have the same thickness T2. In some embodiments, the thickness T1 may be 5 nm to 20 nm and the second thickness T2 may be 5 nm to 20 nm. Alternatively, the first layers 104a, 104b, and 104c may have different thicknesses, and the second layers 106a, 106b, and 106c may have different thicknesses. In some other embodiments, the first layers 104 and the second layers 106 have the same or different thicknesses.

As shown in FIG. 1, a mask layer 108 is formed on the semiconductor stack 102. The mask layer 108 may include a single-layered structure, a two-layered structure, or a multi-layered structure. For example, the mask layer 108 includes a silicon oxide (SiO) layer and a silicon nitride (SiN) layer on the SiO layer. In some embodiments, the mask layer 108 is formed by CVD, ALD, or the like.

Figure 2:
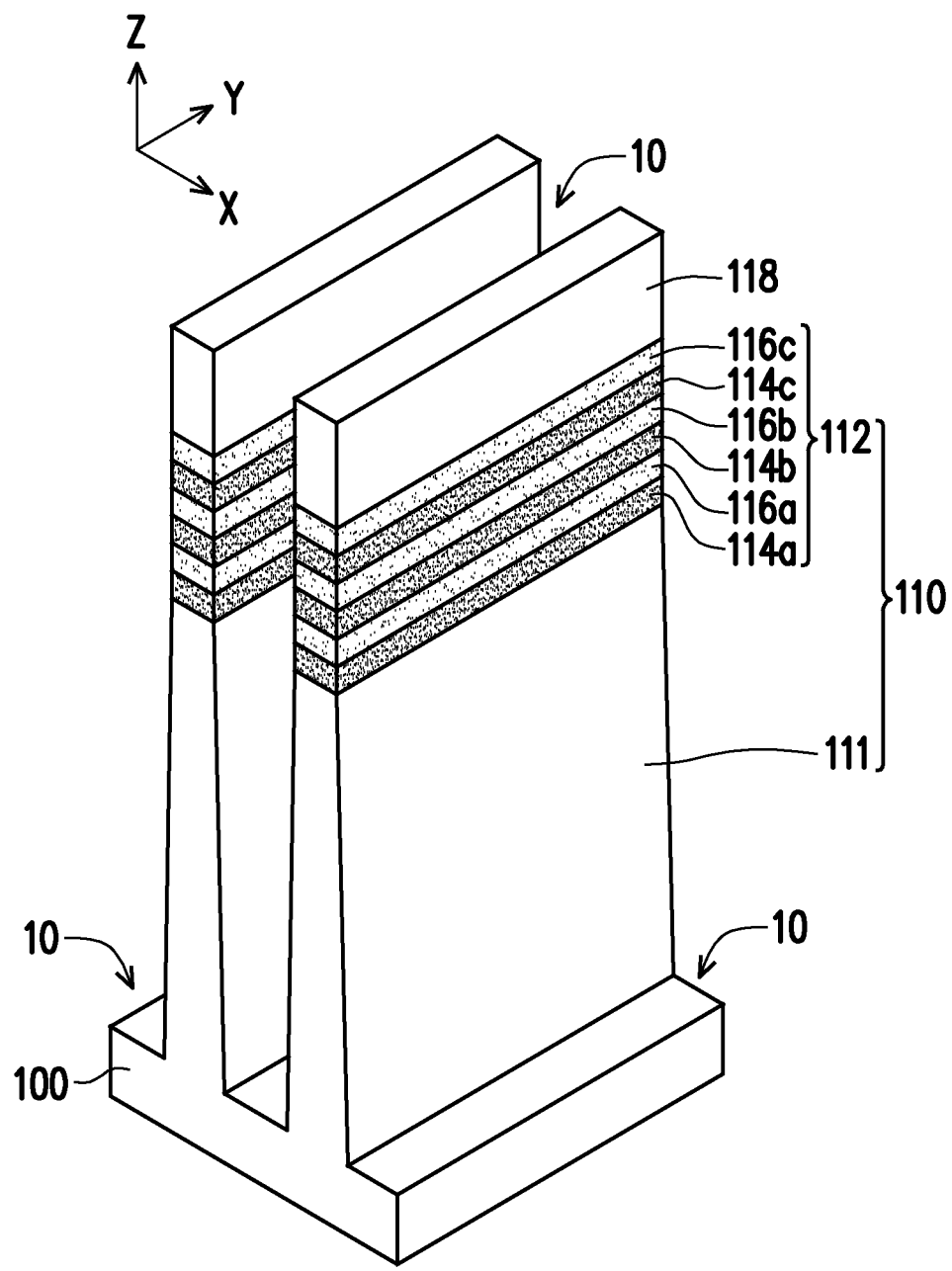

Referring to FIG. 1 and FIG. 2, the mask layer 108 is patterned to form a plurality of mask strips 118. The semiconductor stack 102 and the substrate 100 are then patterned by using the mask strips 118 as a mask, so as to form a plurality of trenches 10. In the case, a plurality of fins 111 and a plurality of stacks of semiconductor strips 112 on the fins 111 are formed between the trenches 10. As shown in FIG. 2, the trenches 10 extend into the substrate 100, and have lengthwise directions parallel to each other. Herein, the stacks of semiconductor strips 112 are referred to as nanosheet stacks 112 and the combination of the fins 111 and the nanosheet stacks 112 thereon are referred to as hybrid fins 110, alternatively. Although only two hybrid fins 110 are illustrated in FIG. 2, the embodiments of the present disclosure are not limited thereto. In other embodiments, the number of the hybrid fins 110 may be adjusted by the need, such as one hybrid fin, three hybrid fins, four hybrid fins, or more hybrid fins. In addition, the mask strips 118 illustrated in FIG. 2 have flat top surfaces. However, the embodiments of the present disclosure are not limited thereto. In other embodiments, the mask strips 118 may have dome top surfaces due to the high aspect ratio etching.

As shown in FIG. 2, in some embodiments, the nanosheet stack 112 include a plurality of first nanosheets 114a, 114b, 114c (collectively referred to as "first nanosheets 114") and a plurality of second nanosheets 116a, 116b, 116c (collectively referred to as "second nanosheets 116") stacked alternately along a Z direction and extending along a Y direction.

Figure 3:
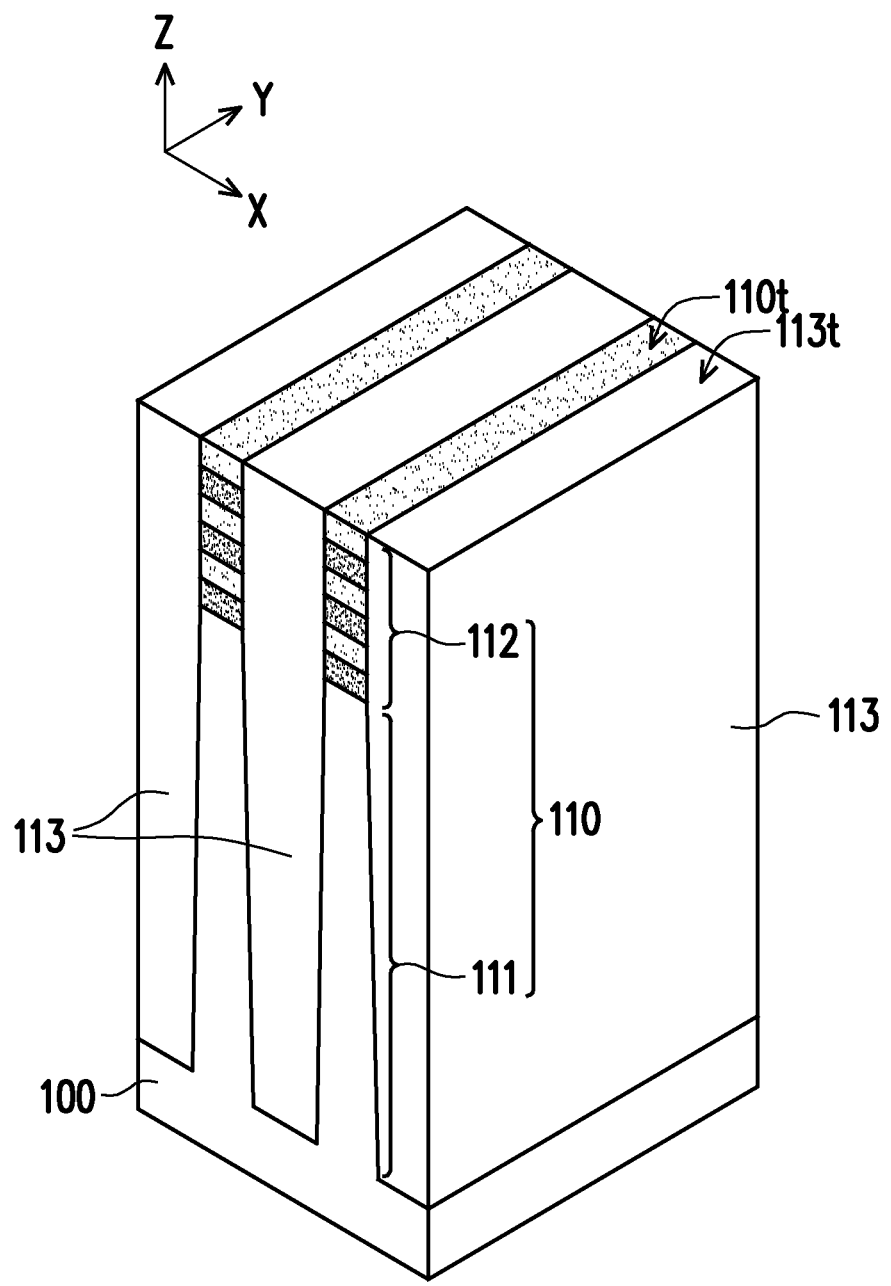

Referring to FIG. 2 and FIG. 3, a plurality of insulating layers 113 are formed in trenches 10. In detail, in some embodiments, an insulating material is formed on the substrate 100 to cover the hybrid fins 110 and to fill up the trenches 10. In addition to the hybrid fins 110, the insulating material further covers the mask strips 118. The insulating material may include silicon oxide, silicon nitride, silicon oxynitride, a spin-on dielectric material, or a low-k dielectric material. Herein, the low-k dielectric materials are generally dielectric materials having a dielectric constant lower than 3.9. The insulating material may be formed by flowable chemical vapor deposition (FCVD), high-density-plasma chemical vapor deposition (HDP-CVD), sub-atmospheric CVD (SACVD), or spin on. A planarization process may be performed, to remove a portion of the insulating material and the mask strips 118 until the hybrid fins 110 are exposed. In the case, as shown in FIG. 3, top surfaces 110t of the hybrid fins 110 are substantially coplanar with a top surface 113t of the planarized insulating material or insulating layers 113. In some embodiments, the planarization process includes a chemical mechanical polish (CMP), an etching back process, a combination thereof, or the like.

Figure 4:
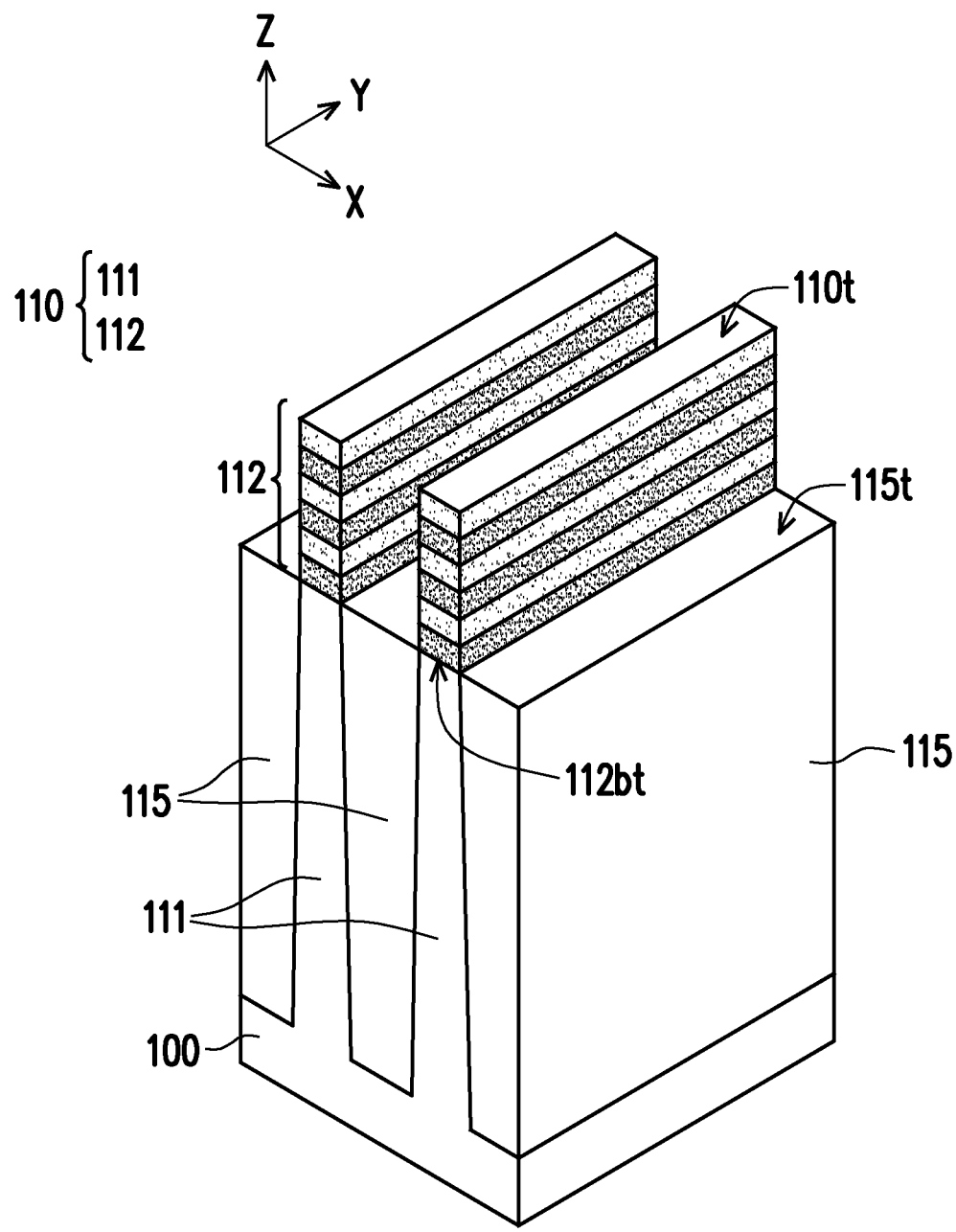

Referring to FIG. 3 and FIG. 4, the insulating layers 113 are recessed to form a plurality of isolation regions 115. After recessing the insulating layers 113, the hybrid fins 110 protrude from top surfaces 115t of the isolation regions 115. That is, the top surfaces 115t of the isolation regions 115 may be lower than the top surfaces 110t of the hybrid fins 110. In some embodiments, the nanosheet stacks 112 are exposed by the isolation regions 115. That is, the top surfaces 115t of the isolation regions 115 may be substantially coplanar with or lower than bottom surfaces 112bt of the nanosheet stacks 112. Further, the top surfaces 115t of the isolation regions 115 may have a flat surface as illustrated, a convex surface, a concave surface (such as dishing), or a combination thereof. In some embodiments, the insulating layers 113 are recessed by using an appropriate etching process, such as a wet etching process with hydrofluoric acid (HF), a dry etching process, or a combination thereof. In some embodiments, a height difference between the top surfaces 110t of the hybrid fins 110 and the top surfaces 115t of the isolation regions 115 ranges from about 30 nm to about 100 nm. In some embodiments, the isolation regions 115 may be shallow trench isolation (STI) regions, deep trench isolation (DTI) regions, or the like.

Figure 5:
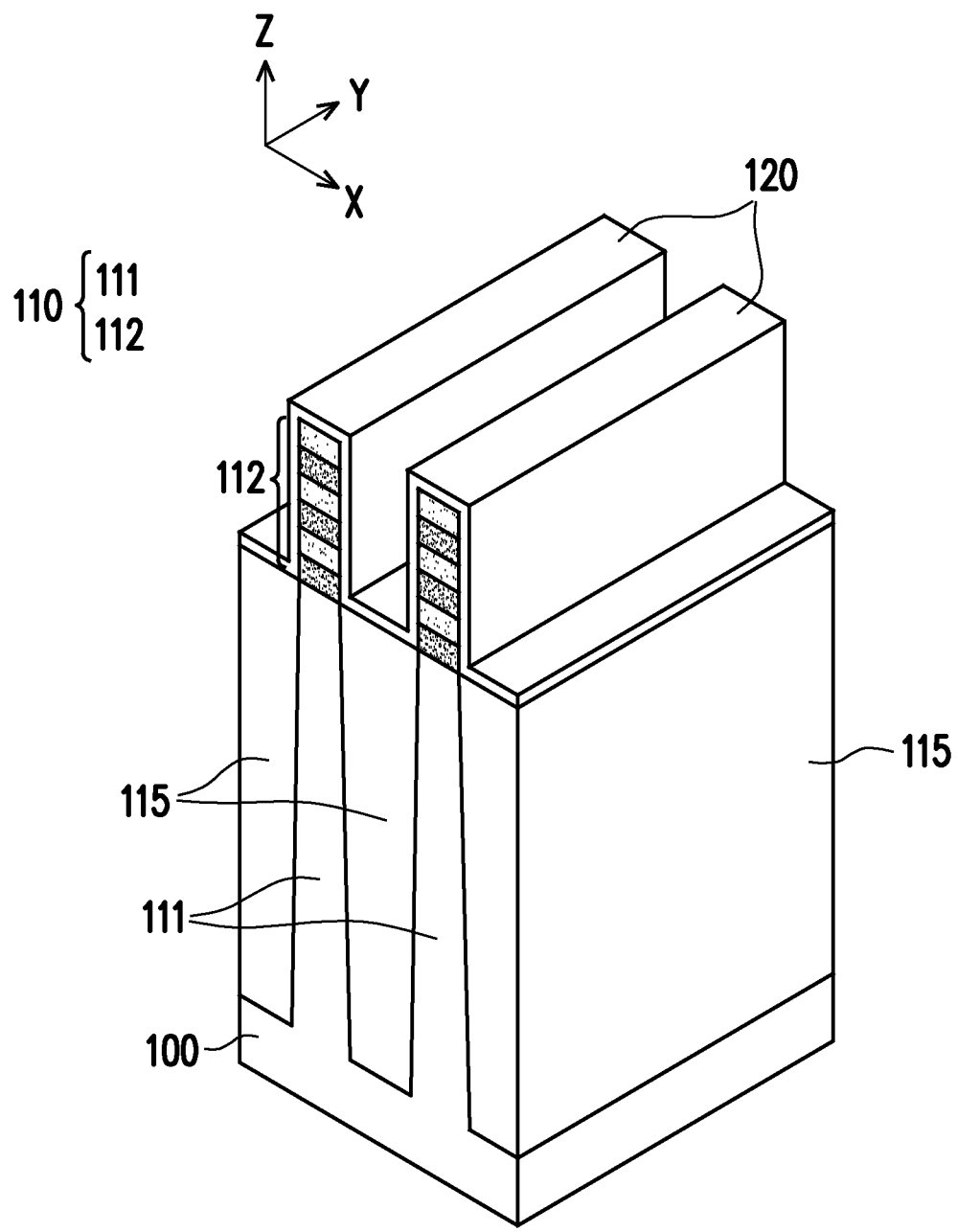

Referring to FIG. 4 and FIG. 5, a dummy dielectric layer 120 is formed on the substrate 100. In detail, as shown in FIG. 5, the dummy dielectric layer 120 conformally cover the surfaces of the nanosheet stacks 112 and the top surfaces 115t of the isolation regions 115. In some embodiments, the dummy dielectric layer 120 includes silicon oxide, silicon nitride, silicon oxynitride, or the like, and may be formed by CVD, ALD or the like. In some alternative embodiments, the dummy dielectric layer 120 and the isolation regions 115 have the same or different dielectric materials.

Figure 6:
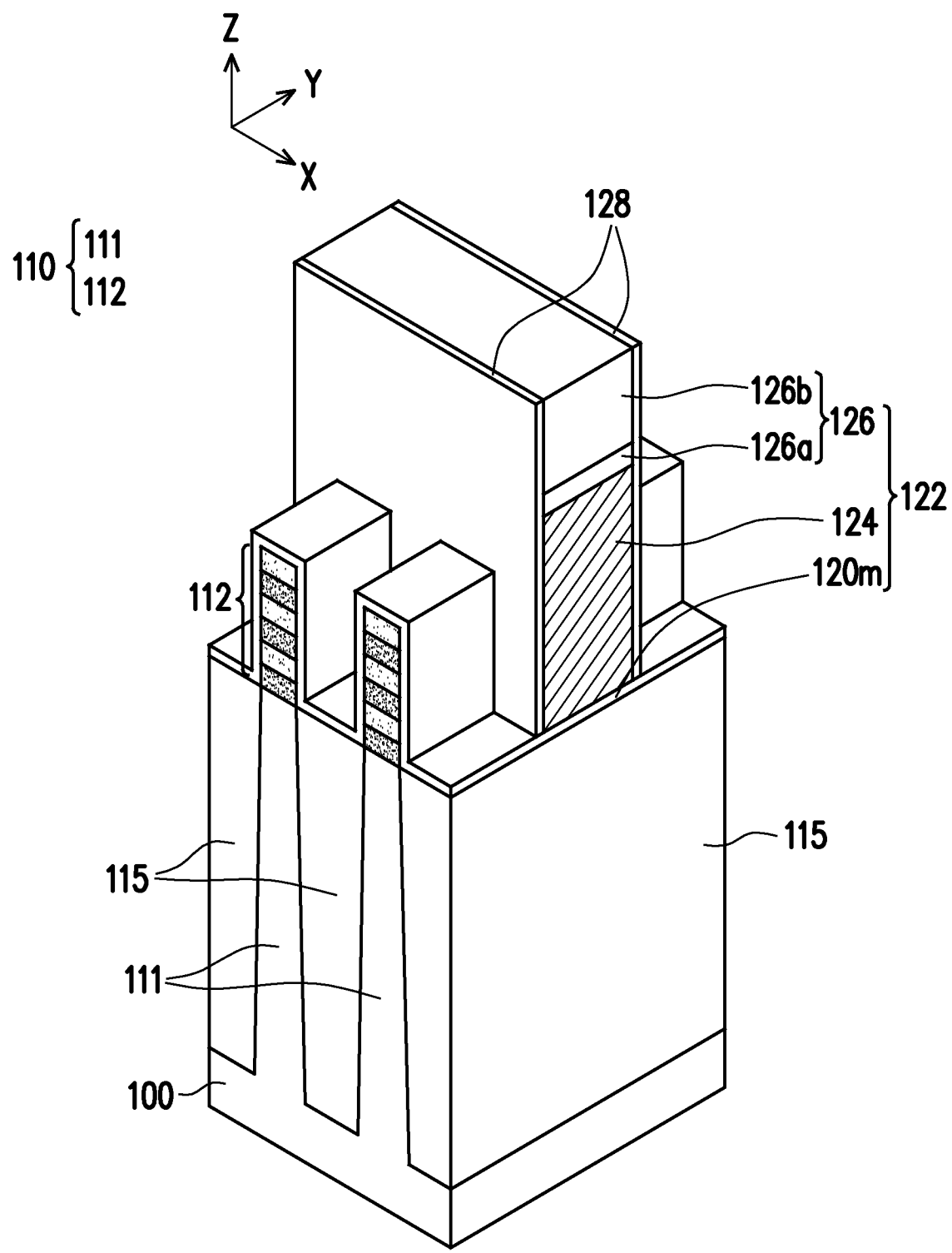

Referring to FIG. 6, a dummy gate stack 122 is formed over portions of the nanosheet stacks 112 and portion of the isolation regions 115. The dummy gate stack 122 may extend along a X direction perpendicular to the extending direction of the nanosheet stacks 112. That is, the dummy gate stack 122 may be formed across the nanosheet stacks 112.

Specifically, the dummy gate stack 122 may include dummy gate electrode 124 and a portion of the dummy dielectric layer 120 covered by the dummy gate electrode 124. Herein, the portion of the dummy dielectric layer 120 covered by the dummy gate electrode 124 may be referred to as dummy gate dielectric layer 120m. In some embodiments, the dummy gate electrode 124 includes a silicon-containing material, such as poly-silicon, amorphous silicon, or a combination thereof. The dummy gate electrode 124 may be formed by using a suitable process, such as ALD, CVD, PVD, plating, or combinations thereof. Although the dummy gate electrode 124 illustrated in FIG. 6 is a single-layered structure, the embodiments of the present disclosure are not limited thereto. In other embodiments, the dummy gate electrode 124 may be a multi-layered structure. The dummy gate stack 122 may also include hard mask layer 126 over dummy gate electrode 124. In some embodiments, the hard mask layer 126 includes a single-layered structure, a two-layered structure, a multi-layered structure. For example, the hard mask layer 126 includes a silicon oxide layer 126a and a silicon nitride layer 126b over the silicon oxide layer 126a.

As shown in FIG. 6, a pair of spacers 128 are also formed on sidewalls of the dummy gate stack 122. In some embodiments, the spacers 128 and the dummy gate stack 122 have the same extending direction, namely, the X direction. Similar to the dummy gate stack 122, the spacers 128 are also formed across the nanosheet stacks 112. In some embodiments, the spacers 128 are formed of dielectric materials, such as silicon oxide, silicon nitride, carbonized silicon nitride (SiCN), SiCON, or a combination thereof. Although the spacers 128 illustrated in FIG. 6 is a single-layered structure, the embodiments of the present disclosure are not limited thereto. In other embodiments, the spacers 128 may be a multi-layered structure. For example, the spacer 128 may include a silicon oxide layer and a silicon nitride layer on the silicon oxide layer. As shown in FIG. 6, the dummy gate stack 122 and the spacers 128 cover middle portions of the nanosheet stacks 112, and reveal the opposite end portions not covered.

Figure 7:
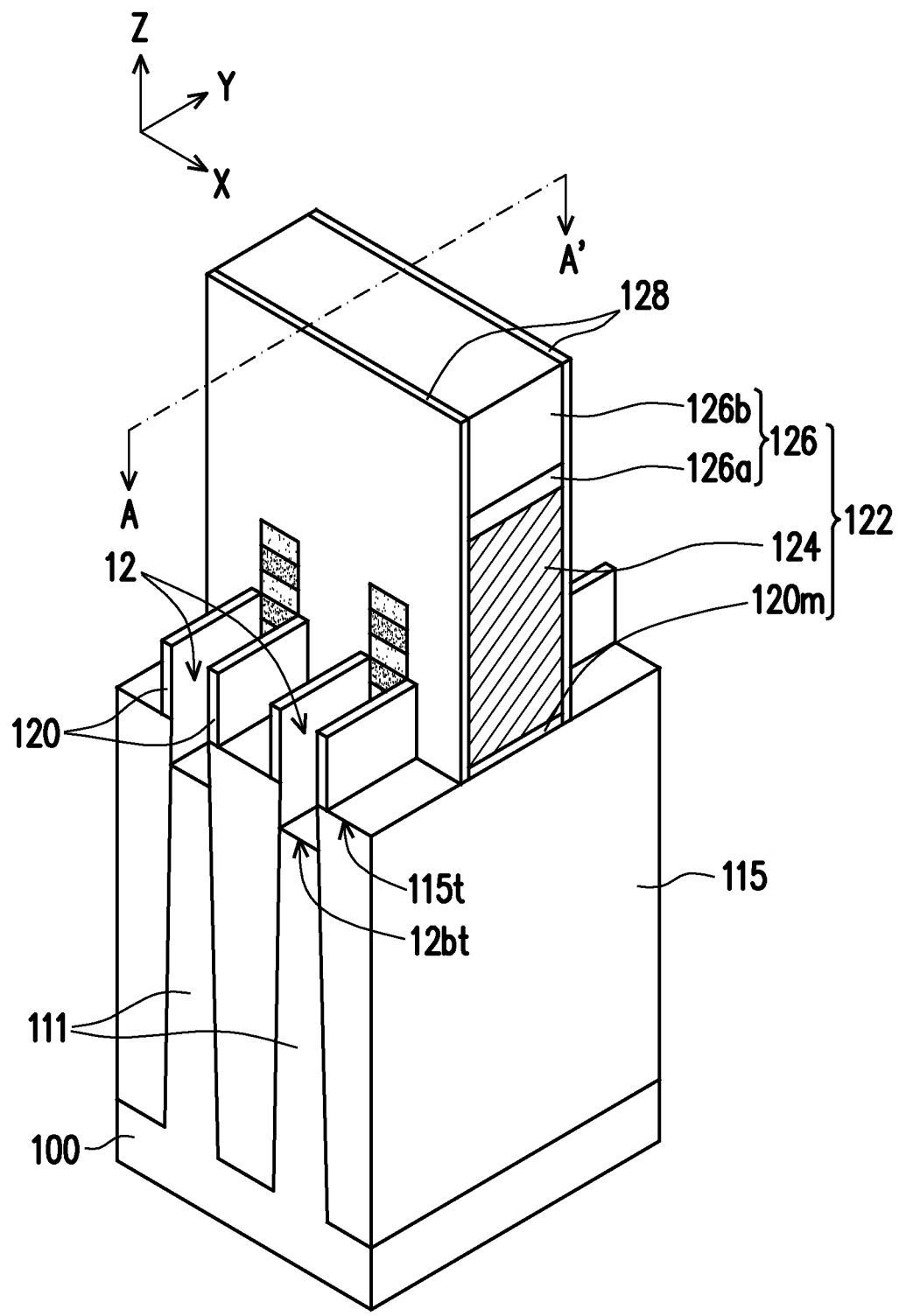

Referring to FIG. 6 and FIG. 7, the end portions of the nanosheet stacks 112 are removed and recessed to form recesses 12. Herein, the recesses 12 may be referred to as source/drain (S/D) recesses 12. In some embodiments, the end portions of the nanosheet stacks 112 may be removed by an anisotropic etching process, an isotropic etching process, or a combination thereof. In some embodiments, the S/D recesses 12 further extend into the fins 111 and lower than the top surfaces 115t of the isolation regions 115. In other words, the end portions of the nanosheet stacks 112 are entirely removed and portions of the fins 111 are further removed. In the case, as shown in FIG. 7, the bottom surfaces 12bt of the S/D recesses 12 are lower than the top surfaces 115t of the isolation regions 115. In some embodiments, some portions of the dummy dielectric layer 120 are removed and other portions of the dummy dielectric layer 120 may be left standing over and aligned to the edges of isolation regions 115, with the S/D recesses 12 formed therebetween. In addition, portions of the dummy dielectric layer 120 (in FIG. 6) covered by the spacers 128 may be considered to as portions of the spacers 128 as shown in FIG. 7. The spacers 128 may cover sidewalls of the dummy gate stack 122 which includes the dummy gate dielectric layer 120m, the dummy gate electrode 124, and the hard mask layer 126.

Figure 8:
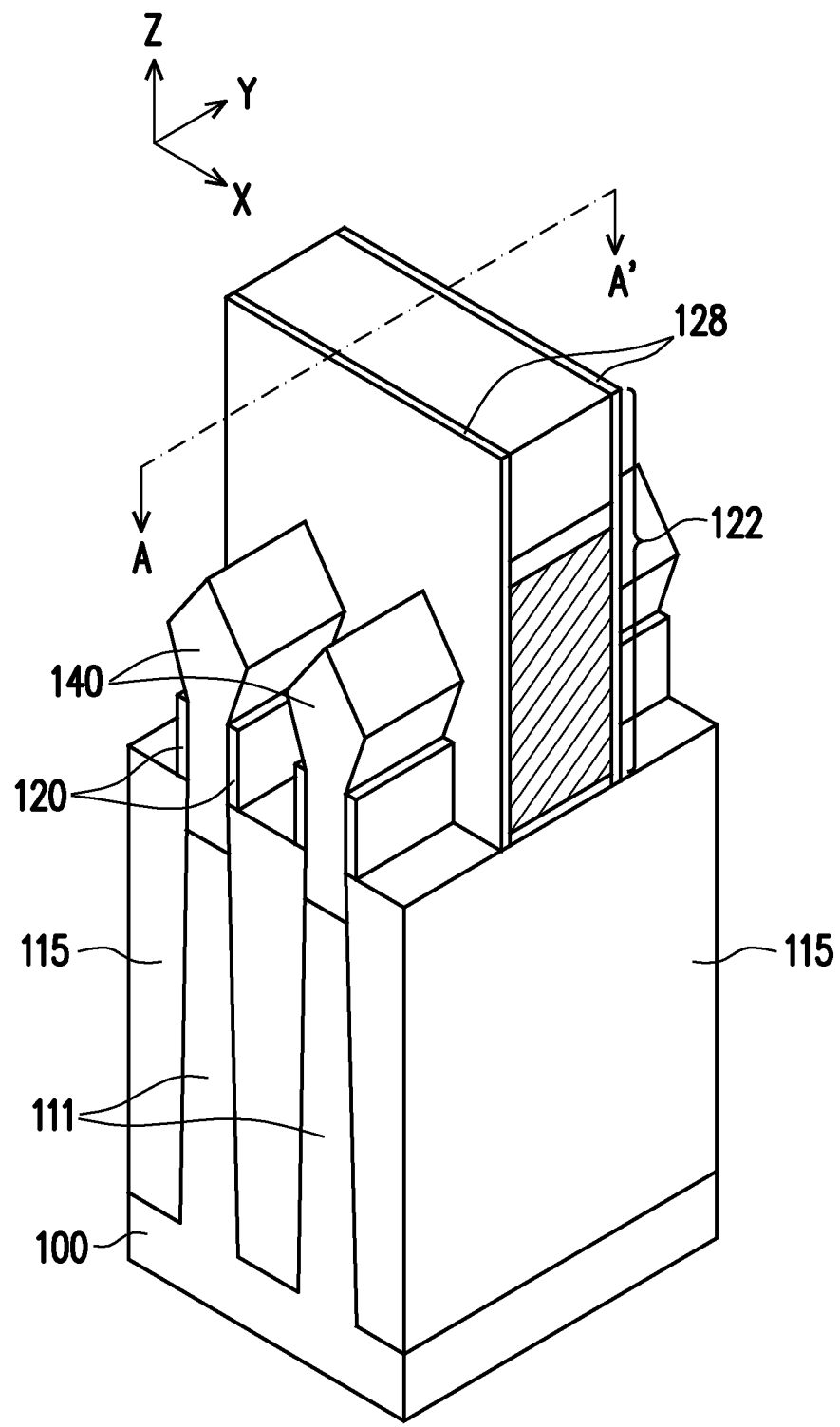

It should be noted that, after forming the S/D recesses 12, a plurality of inner spacers 132 and a liner layer 134 may be formed before forming source/drain (S/D) regions 140 (as shown in FIG. 8). For clarity, the forming steps are shown in FIGS. 13, 14A-14C, 15A-15C, 16A-16F, 17, and 18 which correspond fragmentary cross-sectional views of a semiconductor device in FIG. 7 to FIG. 8 taken along the line A-A'.

Figure 13:
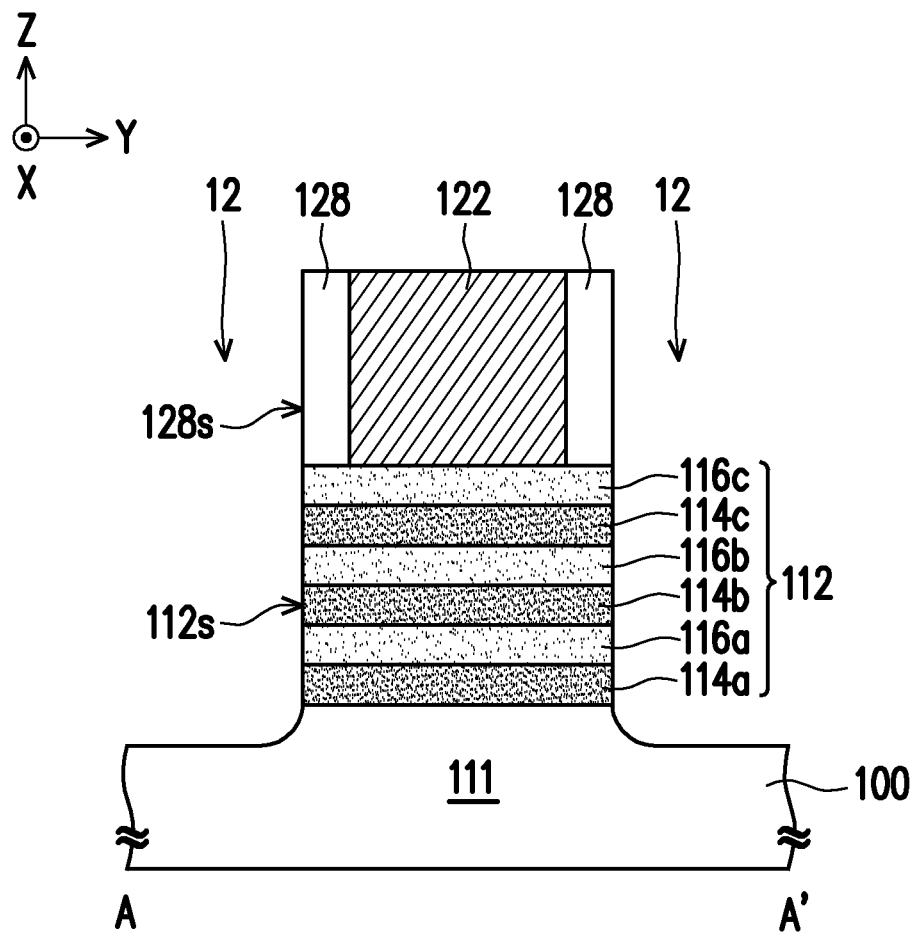
FIGS. 13, 14A-14C, 15A-15C, 16A-16F, 17, and 18 are corresponding fragmentary cross-sectional views of a semiconductor device in FIG. 7 to FIG. 8 taken along the line A-A' in accordance with some embodiments of the disclosure.

Referring to FIG. 13, after forming the S/D recesses 12, a sidewall 112s of the nanosheet stacks 112 may be aligned with an outer sidewall 128s of the spacers 128. For clarity, the dummy gate stack 122 in the following cross-sectional views are illustrated as a single layer.

Figure 14A:
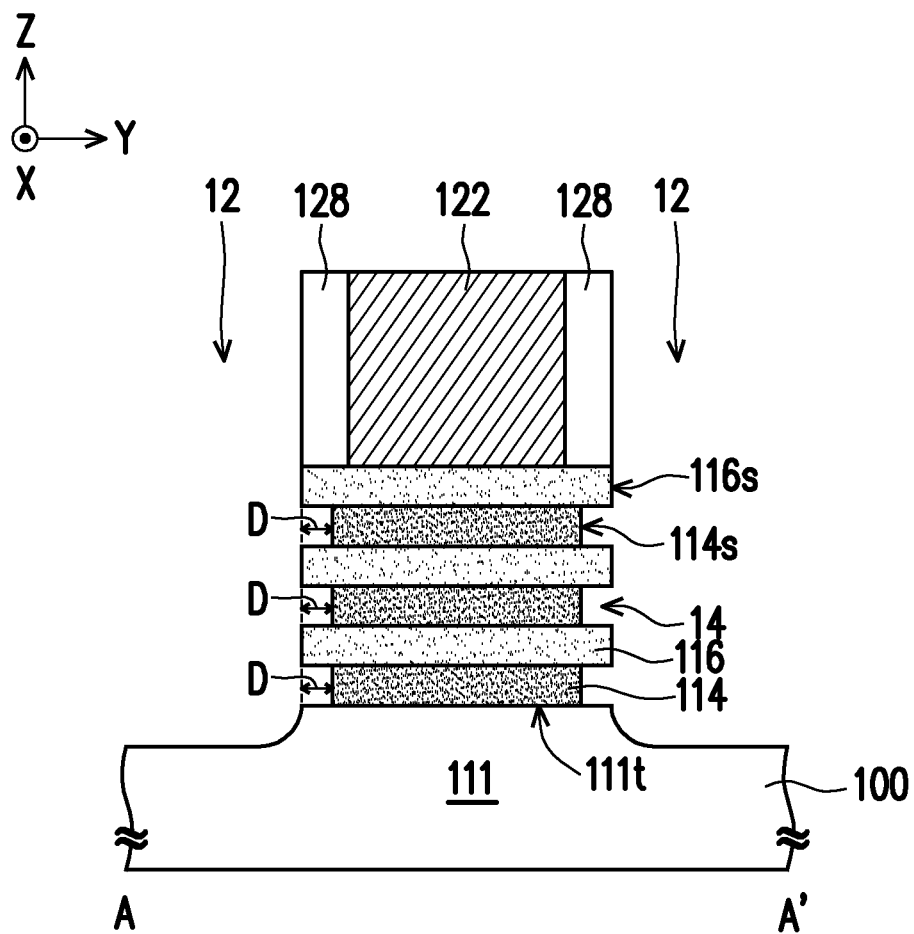

Referring to FIG. 13 and FIG. 14A, portions of the first nanosheets 114 are laterally recessed. In some embodiments, the portions of the first nanosheets 114 exposed by the S/D recesses 12 are removed, and thus as shown in FIG. 14A, a plurality of cavities 14 are respectively formed between the second nanosheets 116. In some embodiments, the first nanosheets 114 are laterally recessed by a wet etching, a dry etching, or a combination thereof. For example, the first nanosheets 114 may be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. Alternatively, before laterally recessing the portions of the first nanosheets 114, the end portions of the first nanosheets 114 exposed by the recesses 12 may be selectively oxidize, so as to increase the etching selectivity between the first and second nanosheets 114 and 116. In some alternative embodiments, the oxidation process may be performed by exposing to a wet oxidation process, a dry oxidation process, or a combination thereof. The chemical used in the oxidation process may include H$_2$SO$_4$ or the like.

Figure 14B:
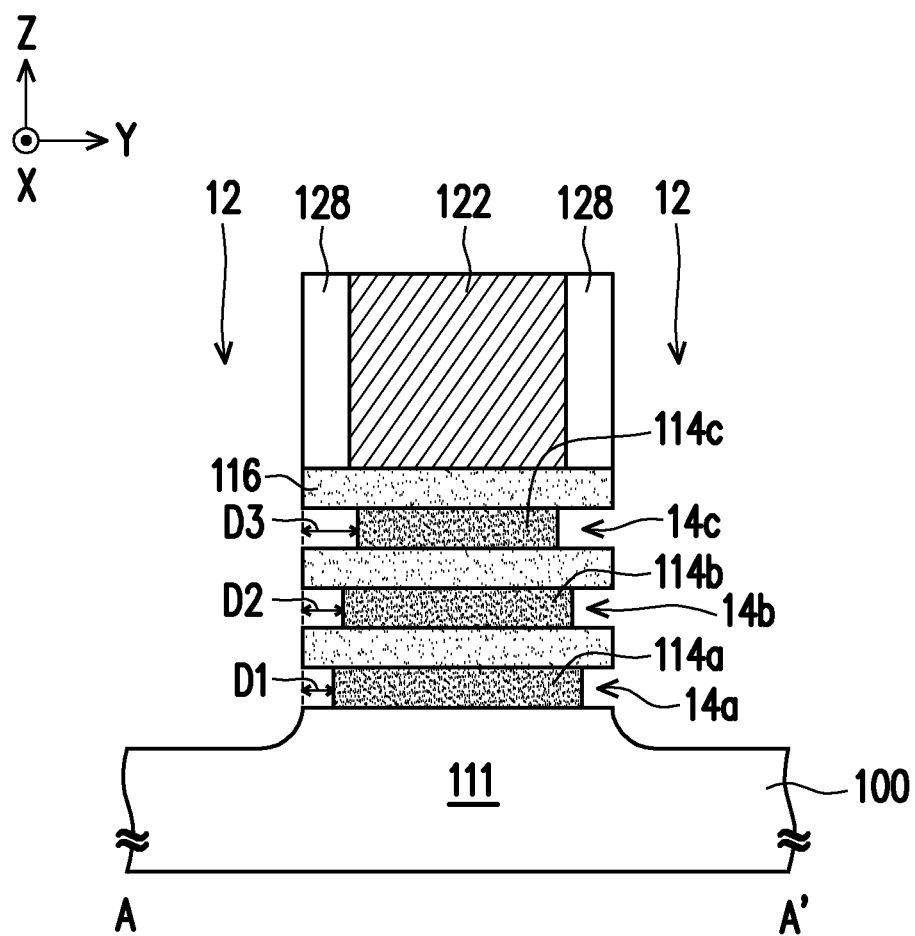
Figure 14C:
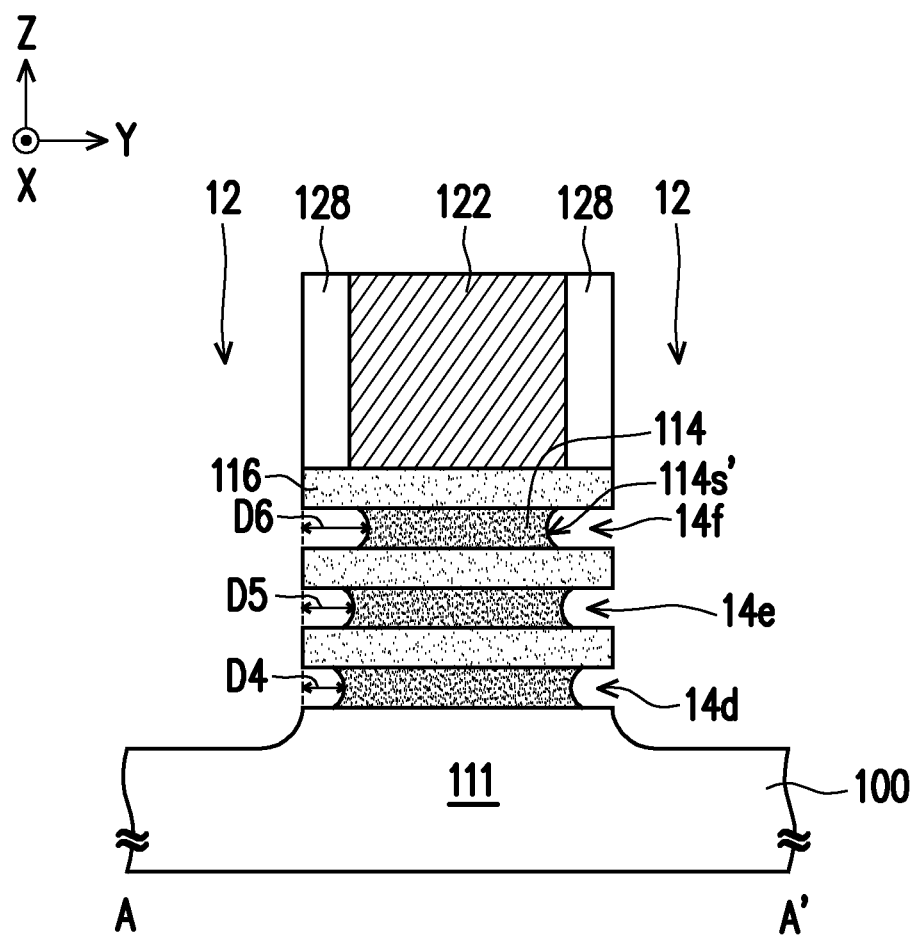
Figure 15A:
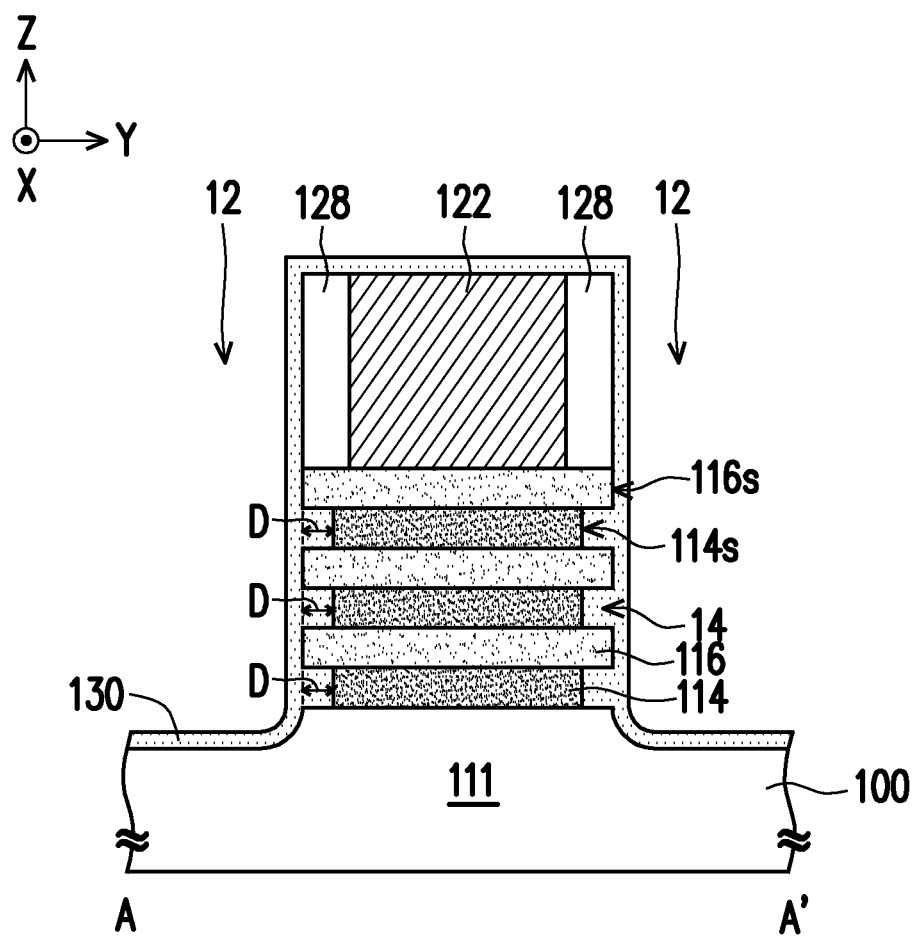
Figure 15B:
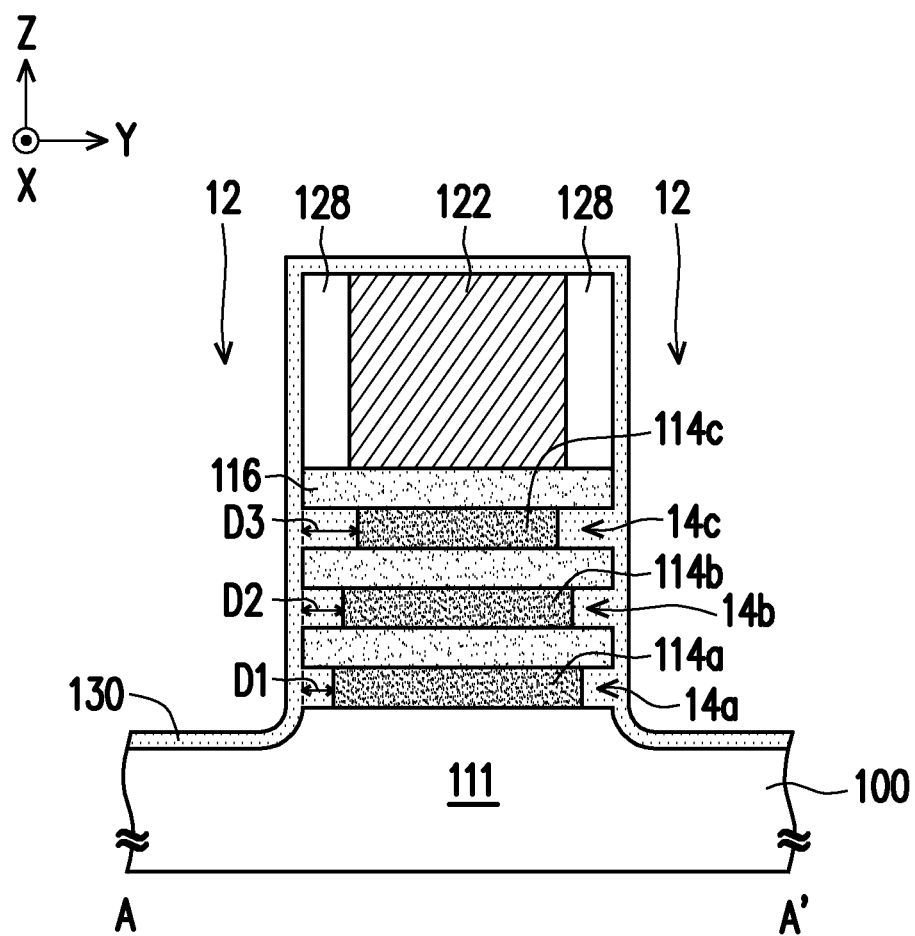
Figure 15C:
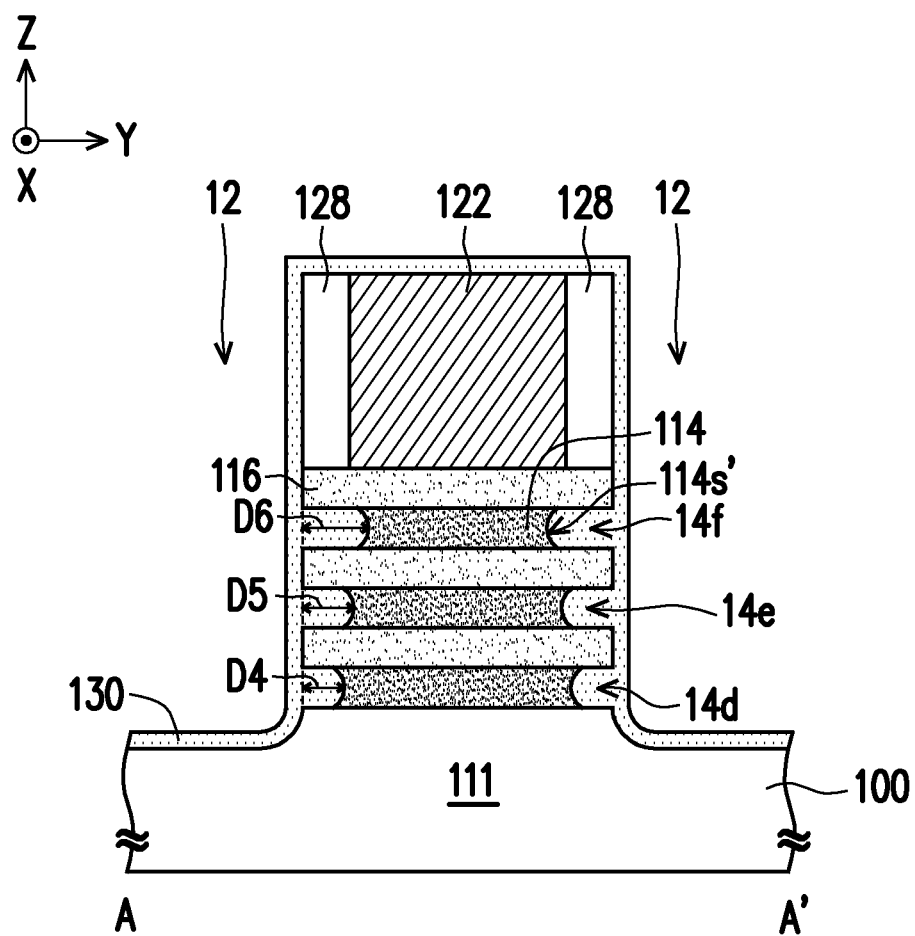

In some embodiments, as shown in FIG. 14A, the cavities 14 have the same (lateral) depth D. The depth D may be in a range from about 5 nm to about 20 nm. Herein, the depth D is respectively measured from the sidewall 116s of one second nanosheet 116 to the sidewall 114s of the respective first nanosheet 114. In other words, the sidewalls 116s of the second nanosheets 116 are not aligned with the sidewalls 114s of the first nanosheet 114. However, the embodiments of the present disclosure are not limited thereto, in other embodiments, as shown in FIG. 14B, the cavities 14a, 14b, and 14c have different depths D1, D2, and D3. In the case, the uppermost first nanosheet 114c is in contact with the etchant for a longer time than the underlying first nanosheet 114a, and thus a removal amount of the uppermost first nanosheet 114c is greater than a removal amount of the underlying first nanosheet 114b. Similarly, the removal amount of the first nanosheet 114b is greater than a removal amount of the underlying first nanosheet 114a. Accordingly, as shown in FIG. 14B, the cavity 14c has a depth D3 greater than a depth D2 of the cavity 14b, and the cavity 14a has a depth D1 less than the depth D2 of the cavity 14b. That is, the depths D1, D2, and D3 gradually increase from bottom to top, namely, D1<D2<D3. In some embodiments, the sidewalls 114s of the first nanosheets 114 are not aligned with each other. The depth D1 may be in a range from about 5 nm to about 15 nm, the depth D2 may be in a range from about 6 nm to about 16 nm, the depth D3 may be in a range from about 7 nm to about 17 nm. The sidewalls 114s of the first nanosheets 114 illustrated in FIG. 14A are vertical sidewalls substantially perpendicular to the top surface 111t of the fin 111. However, the embodiments of the present disclosure are not limited thereto, in some alternative embodiments, as shown in FIG. 14C, the sidewalls 114s' of the first nanosheets 114 illustrated in FIG. 14C are curved or arc sidewalls protruding from the end of the first nanosheets 114 into the center of the first nanosheets 114. In the embodiment, the cavity 14f has a depth D6 greater than a depth D5 of the cavity 14e, and the cavity 14d has a depth D4 less than the depth D5 of the cavity 14e. That is, the depths D4, D5, and D6 gradually increase from bottom to top, namely, D4<D5<D6. The depth D4 may be in a range from about 5 nm to about 15 nm, the depth D5 may be in a range from about 6 nm to about 16 nm, the depth D6 may be in a range from about 7 nm to about 17 nm.

Referring to FIGS. 14A to 14C and FIGS. 15A to 15C, an inner spacer material layer 130 is formed on the substrate 100. In some embodiments, the inner spacer material layer 130 conformally covers the S/D recesses 12, the dummy gate stack 122, and the spacers 128, and further fills in the cavities 14 (including cavities 14a-14f) to reduce the size of the cavities 14 or completely fill in the cavities 14. In some embodiments, the inner spacer material layer 130 includes silicon oxides, silicon nitrides, silicon carbides, silicon carbide nitride, silicon oxide carbide, silicon carbide oxynitride, and/or other suitable dielectric materials, and may be formed by ALD or any other suitable method. In some alternative embodiments, the inner spacer material layer 130 include a low-k dielectric material having a dielectric constant lower than 3.9.

Figure 16A:
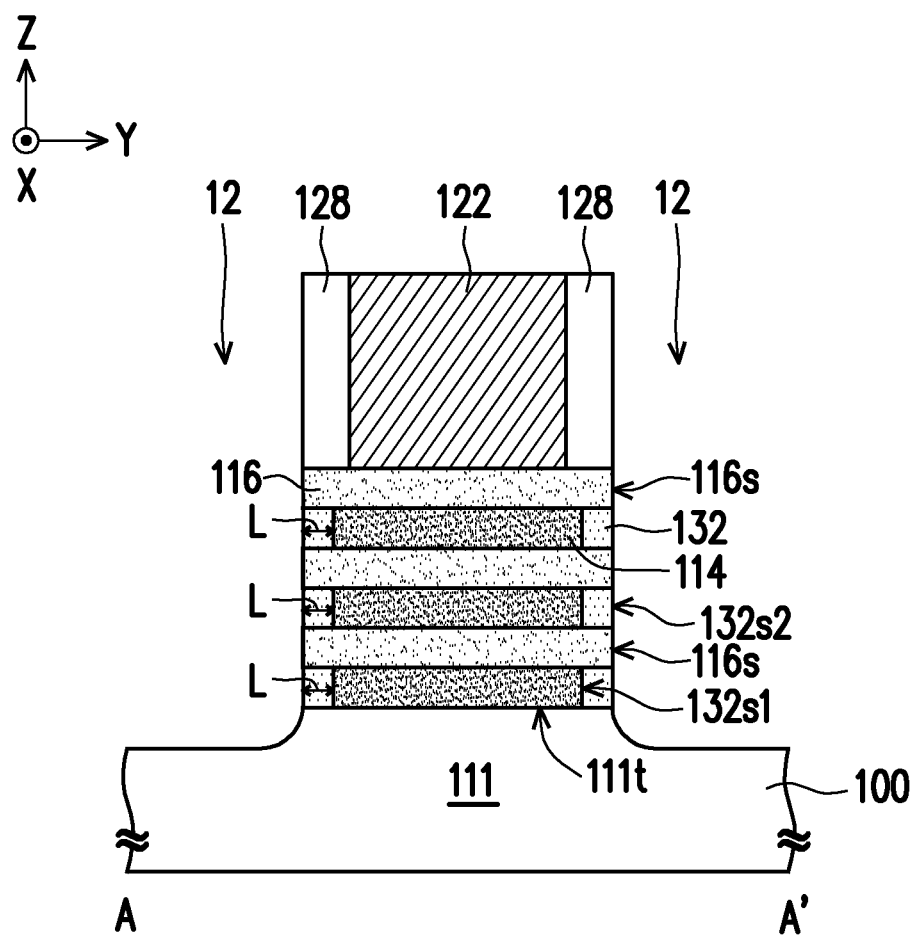
Figure 16B:
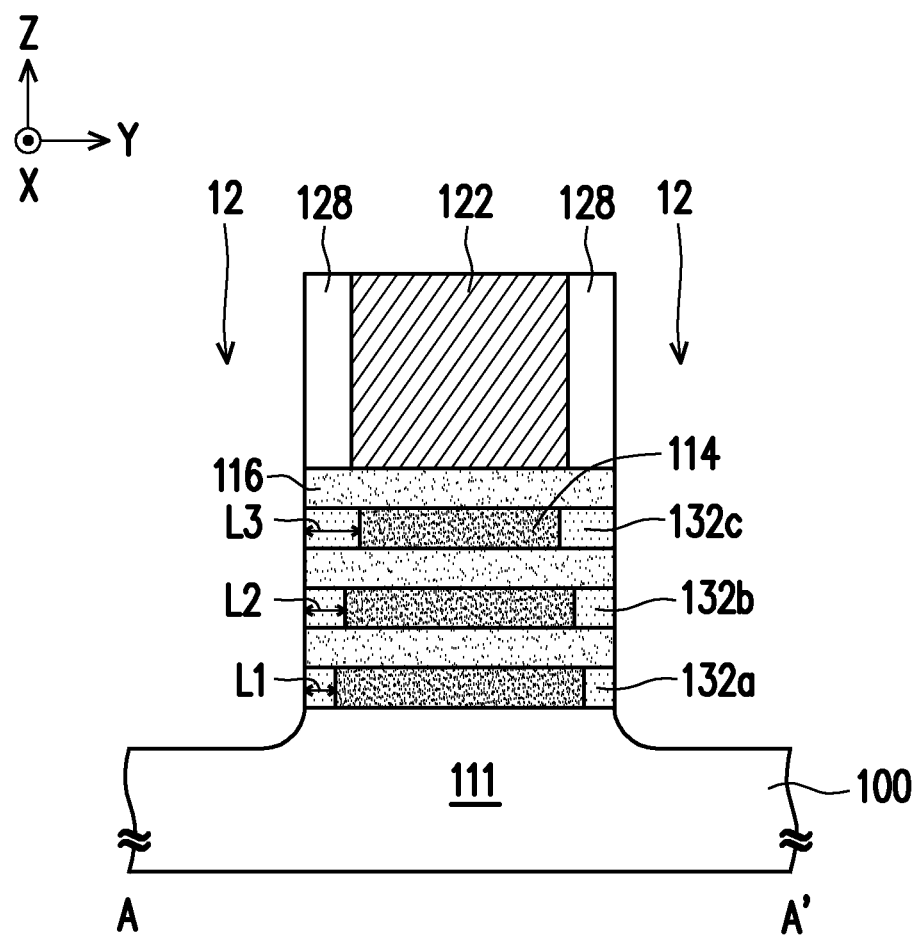
Figure 16C:
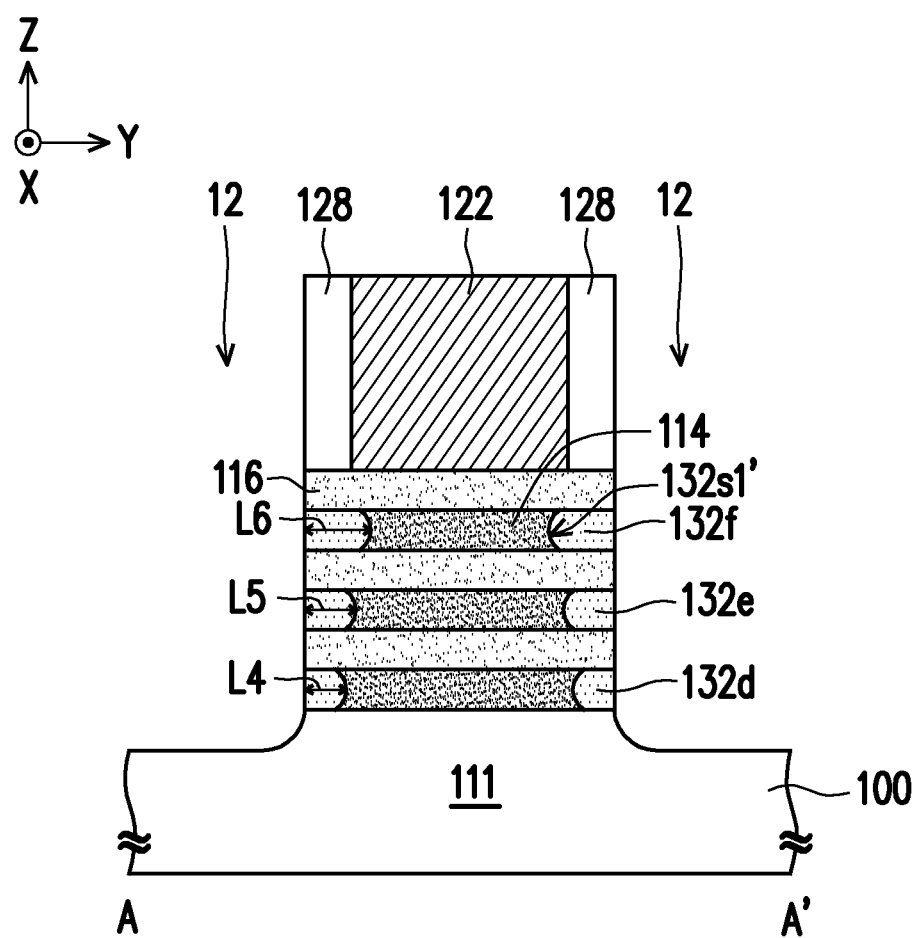

Referring to FIGS. 15A to 15C and FIGS. 16A to 16C, a portion of the inner spacer material layer 130 is removed to form a plurality of inner spacers 132 in the cavities 14. In some embodiments, the portion of the inner spacer material layer 130 is removed by a plasma dry etching or any other suitable method. Generally, the plasma dry etching etches a layer in wide and flat areas faster than a layer in concave (e.g., holes, grooves and/or slits) portions. Thus, the inner spacer material layer 130 may remain inside the cavities 14. The remained portions of the inner spacer material layer 130 is referred to as the inner spacers 132. In some embodiments, as shown in FIG. 16A, the inner spacers 132 have the same length L. The length L may be in a range from about 5 nm to about 20 nm. In other embodiments, as shown in FIG. 16B, the inner spacers 132a, 132b, and 132c have different lengths L1, L2, and L3. The lengths L1, L2, and L3 may gradually increase along a direction from the substrate 100 to the dummy gate stack 122, namely, L1<L2<L3. The length L1 may be in a range from about 5 nm to about 15 nm, the length L2 may be in a range from about 6 nm to about 16 nm, the length L3 may be in a range from about 7 nm to about 17 nm. A ratio of the topmost length L3 to the bottommost length L1 may be in a range of 1.1 to 1.4. The inner sidewalls 132s1 of the inner spacers 132 illustrated in FIG. 16A are vertical sidewalls substantially perpendicular to the top surface 111t of the fin 111. However, the embodiments of the present disclosure are not limited thereto, in some alternative embodiments, the inner sidewalls 132s1' of the inner spacers 132d, 132e, and 132f are curved or arc sidewalls protruding from the end of the first nanosheets 114 into the center of the first nanosheets 114, as shown in FIG. 16C. The inner spacers 132d, 132e, and 132f may have different lengths L4, L5, and L6. The lengths L4, L5, and L6 may gradually increase along a direction from the substrate 100 to the dummy gate stack 122, namely, L4<L5<L6. The length L4 may be in a range from about 5 nm to about 15 nm, the length L5 may be in a range from about 6 nm to about 16 nm, the length L6 may be in a range from about 7 nm to about 17 nm. A ratio of the topmost length L6 to the bottommost length L4 may be in a range of 1.1 to 1.4.

Figure 16D:
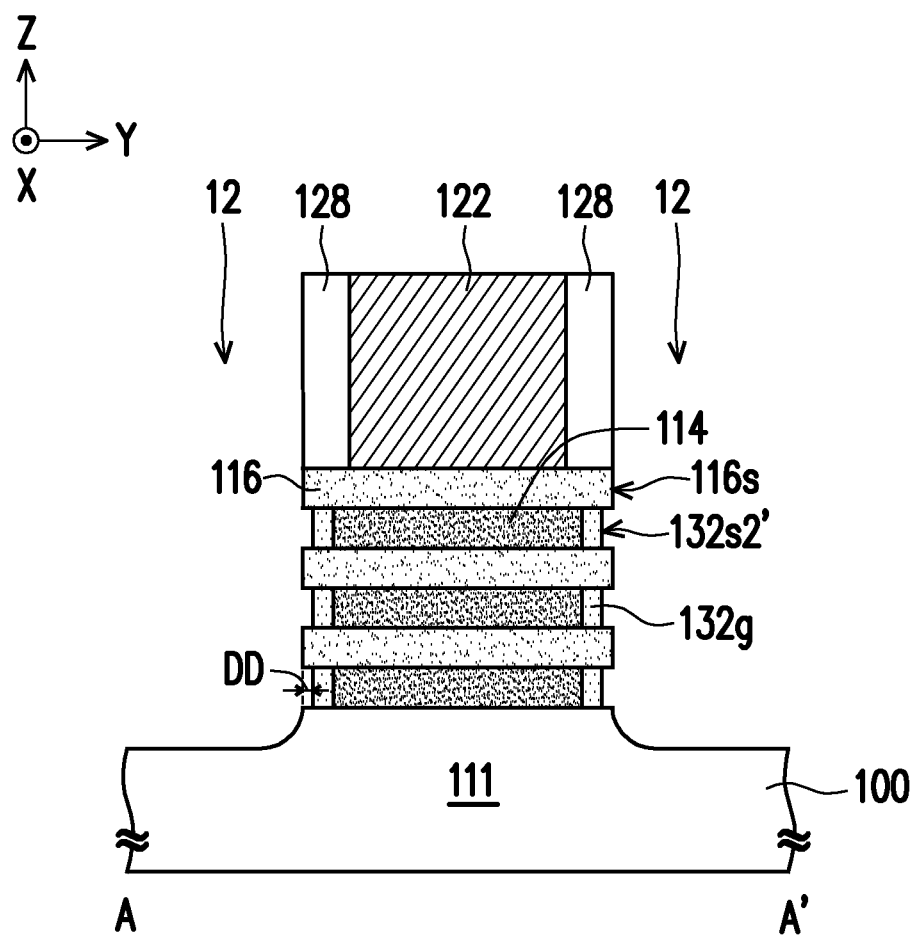
Figure 16E:
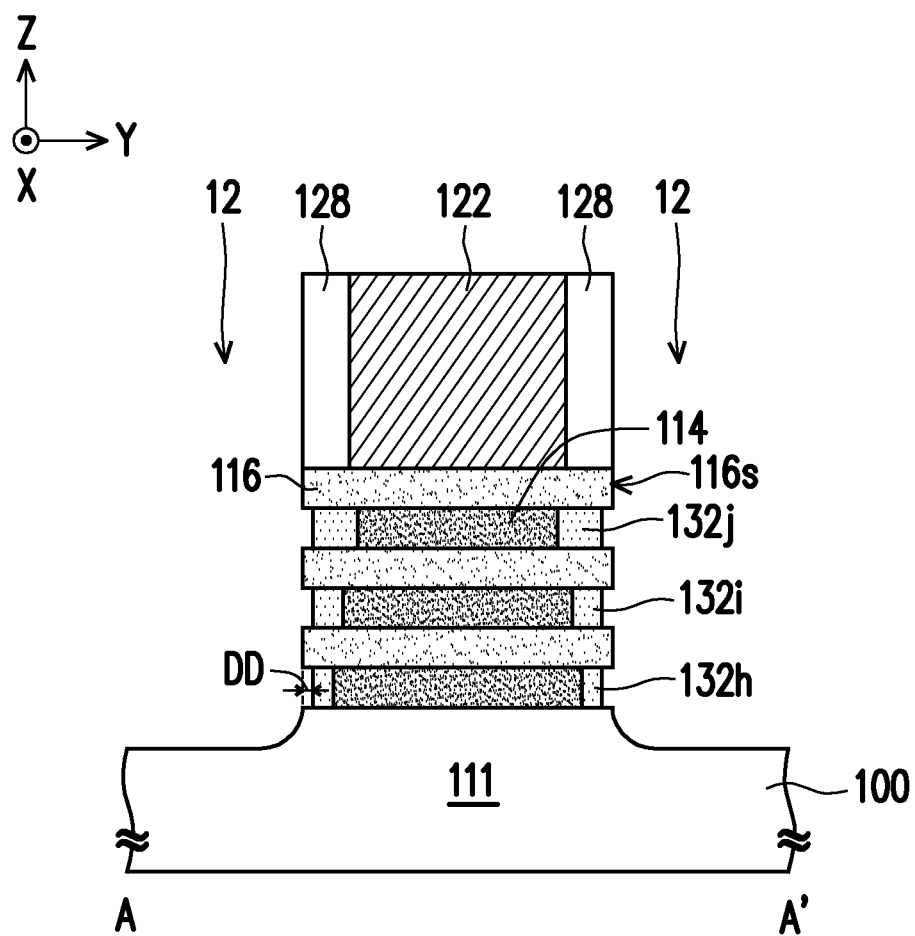

In some embodiments, the outer sidewalls 132s2 of the inner spacers 132 are aligned with the sidewalls 116s of the second nanosheets 116, as shown in FIGS. 16A-16C. That is, the inner spacer material 130 on the sidewalls is etched and the inner spacer material 130 filled in the cavities 14 are not etched during the said plasma dry etching. However, the embodiments of the present disclosure are not limited thereto, in some alternative embodiments, as shown in FIGS. 16D-16E, the outer sidewalls 132s2' of the inner spacers 132 are dented or concave from the sidewalls 116s of the second nanosheets 116. In the case, the inner spacer 132g in FIG. 16D may be shorter than the inner spacer 132 in FIG. 16A, and the inner spacer 132h, 132i, 132j in FIG. 16E may be shorter than the inner spacer 132a, 132b, 132c in FIG. 16B. In some embodiments, as shown in FIG. 16D and FIG. 16E, the dented distances DD are the same to each other. However, the embodiments of the present disclosure are not limited thereto, in other embodiments, the dented distances DD1, DD2, and DD3 may gradually increase along a direction from the substrate 100 to the dummy gate stack 122, namely, DD1<DD2<DD3. It should be noted that the inner spacers 232a, 232b, and 232c (collectively referred to as "inner spacers 232") may be formed as crescent shape. That is, one of the inner spacers 232 has a curved inner sidewall 232s1 and a curved outer sidewall 232s2. The outer sidewalls 232s2 are dented or concave from the sidewalls 116s of the second nanosheets 116. As shown in the enlarged view of FIG. 16F, one of the inner spacers 232 may have a center thickness 232t1 and an edge thickness 232t2 less than the center thickness 232t1. A ratio of the center thickness 232t1 to the edge thickness 232t2 may be in a range of 1.0 to 4.0. Hereinafter, the structure illustrated in FIG. 16F is used as an example for the following steps.

Figure 16F:
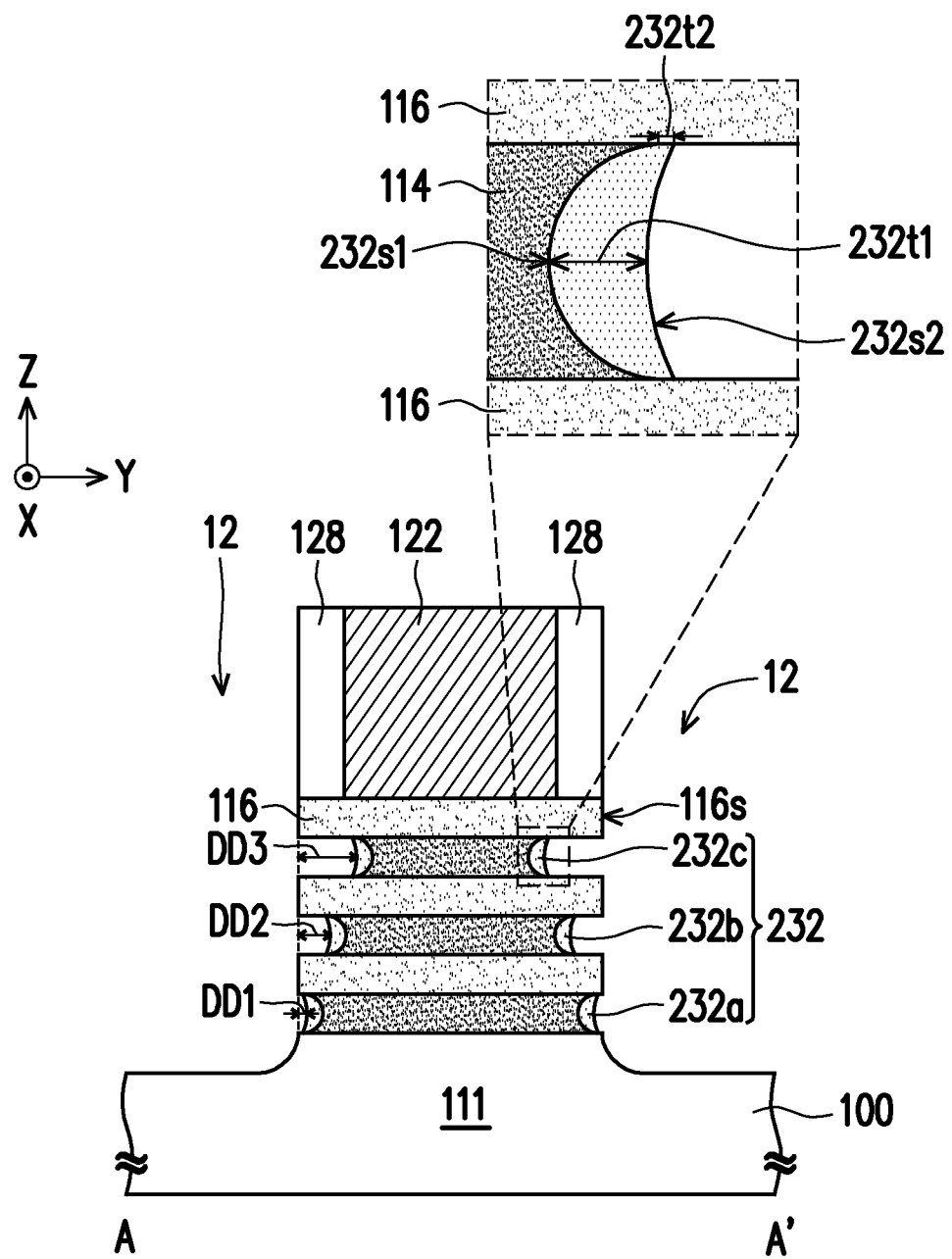
Figure 17:
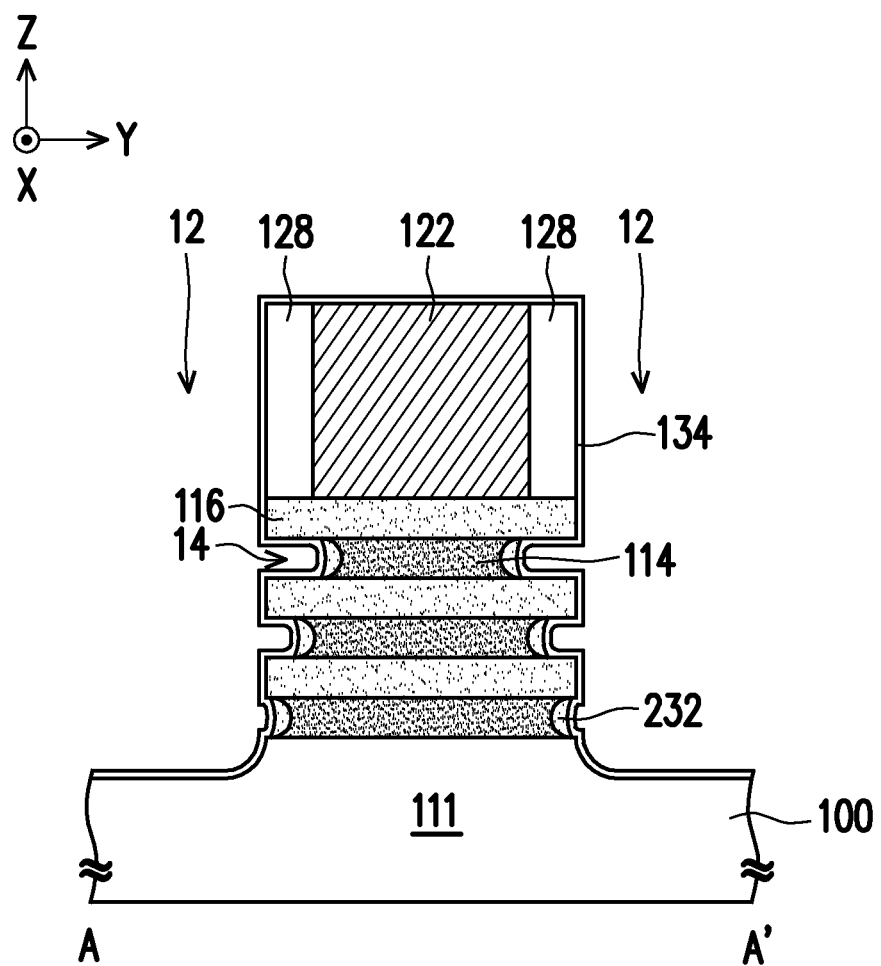

Referring to FIG. 16F and FIG. 17, a liner layer 134 may be formed on the substrate 100. In some embodiments, the liner layer 134 conformally covers the S/D recesses 12 and the cavities 14. The liner layer 134 may be polysilicon layer, a germanium (Ge) layer, a silicon-germanium (SiGe) layer, the like, or a combination thereof, and may be formed by ALD.

Figure 18:
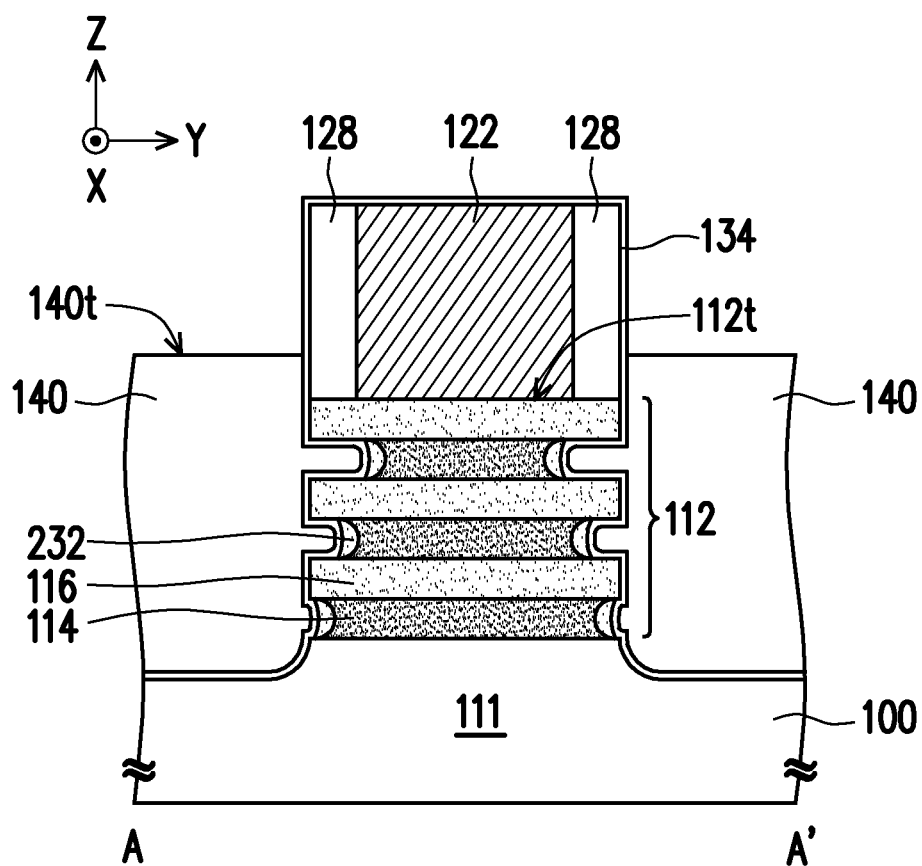

Referring to FIG. 17 and FIG. 18, a strained material 140 (or a highly doped low resistance material) are epitaxially grown from the liner layer 134. FIG. 18 is the corresponding fragmentary cross-sectional view of FIG. 8 taken along the line A-A'. In some embodiments, the strained material 140 is used to strain or stress the second nanosheets (which may be referred to as channel members) 116 and the fins 111. Herein, the strained material 140 may be referred to as S/D regions 140. In the case, the strained material 140 includes a source disposed at one side of the dummy gate stack 122 and a drain disposed at another side of the dummy gate stack 122. The source covers an end of the fins 111, and the drain covers another end of the fins 111. The S/D regions 140 are abutted and electrically connected to the second nanosheets 116 by the liner layer 134, while the S/D regions 140 are electrically isolated from the first nanosheets 114 by the inner spacers 232. In some embodiments, as shown in FIG. 18, the S/D regions 140 extends beyond the top surface 112t of the nanosheet stacks 112. However, the embodiments of the present disclosure are not limited thereto, in other embodiments, the top surface 140t of the S/D regions 140 is substantially aligned with the top surface 112t of the nanosheet stacks 112.

In some embodiments, the S/D regions 140 is derived from the material of the liner layer 134. For example, when the liner layer 134 is polysilicon layer, the strained material 140 may be a silicon-containing material. It should be noted that the liner layer 234 is benefit for forming the S/D regions 140 in the cavities 14. Specifically, the inner spacers 232 made of the dielectric material is not favorable for epitaxially growing the S/D regions, which may form voids between the inner spacers 232 and the S/D regions 140, thereby affecting the strain in the channels and the performance of the device. In other words, the liner layer 234 may provide a good interface for epitaxially growing the S/D regions 140 which is benefit to control the height and shape of the S/D regions 140, thereby reducing void defects and retaining strain in the channels. In addition, a combination of the liner layer 134 and the inner spacers 232 made of the low-k dielectric material may improve the parasitic capacitance, thereby enhancing the performance of the device.

In some other embodiments, the S/D regions 140 include any acceptable material, such as appropriate for p-type FinFETs. For example, if the liner layer 134 is silicon, the S/D regions 140 may include SiGe, SiGeB, Ge, GeSn, or the like. In some alternative embodiments, the S/D regions 140 includes any acceptable material, such as appropriate for n-type FinFETs. For example, if the liner layer 134 is silicon, the S/D regions 140 may include silicon, SiC, SiCP, SiP, or the like. In some embodiments, the S/D regions 140 are formed by MOCVD, MBE, ALD, or the like.

In some embodiments, the S/D regions 140 may be doped with a conductive dopant. For example, the S/D regions 140, such as SiGe, may be epitaxial-grown with a p-type dopant for straining a p-type FinFET. That is, the S/D regions 140 is doped with the p-type dopant to be the source and the drain of the p-type FinFET. The p-type dopant includes boron or $BF_2$, and the S/D regions 140 may be epitaxial-grown by LPCVD process with in-situ doping. In some alternative embodiments, the S/D regions 140, such as SiC, SiP, a combination of SiC/SiP, or SiCP is epitaxial-grown with an n-type dopant for straining an n-type FinFET. That is, the S/D regions 140 is doped with the n-type dopant to be the source and the drain of the n-type FinFET. The n-type dopant includes arsenic and/or phosphorus, and the S/D regions 140 may be epitaxial-grown by LPCVD process with in-situ doping.

As a result of the epitaxial-grown process used to form the S/D regions 140, the cross section of the S/D regions 140 may have a diamond or pentagonal shape as illustrated in FIG. 8. However, the embodiments of the present disclosure are not limited thereto. In other embodiments, the cross section of the S/D regions 140 also have a hexagonal shape, a pillar shape, or a bar shape. In some embodiments, as shown in FIG. 8, adjacent S/D regions 140 are separated from each other after the epitaxial-grown process is completed. Alternatively, adjacent S/D regions 140 may be merged. In some alternative embodiments, the liner layer 134 on the top surface and the sidewalls of the dummy gate stack 122 may be removed after forming the S/D regions 140.

Figure 9:
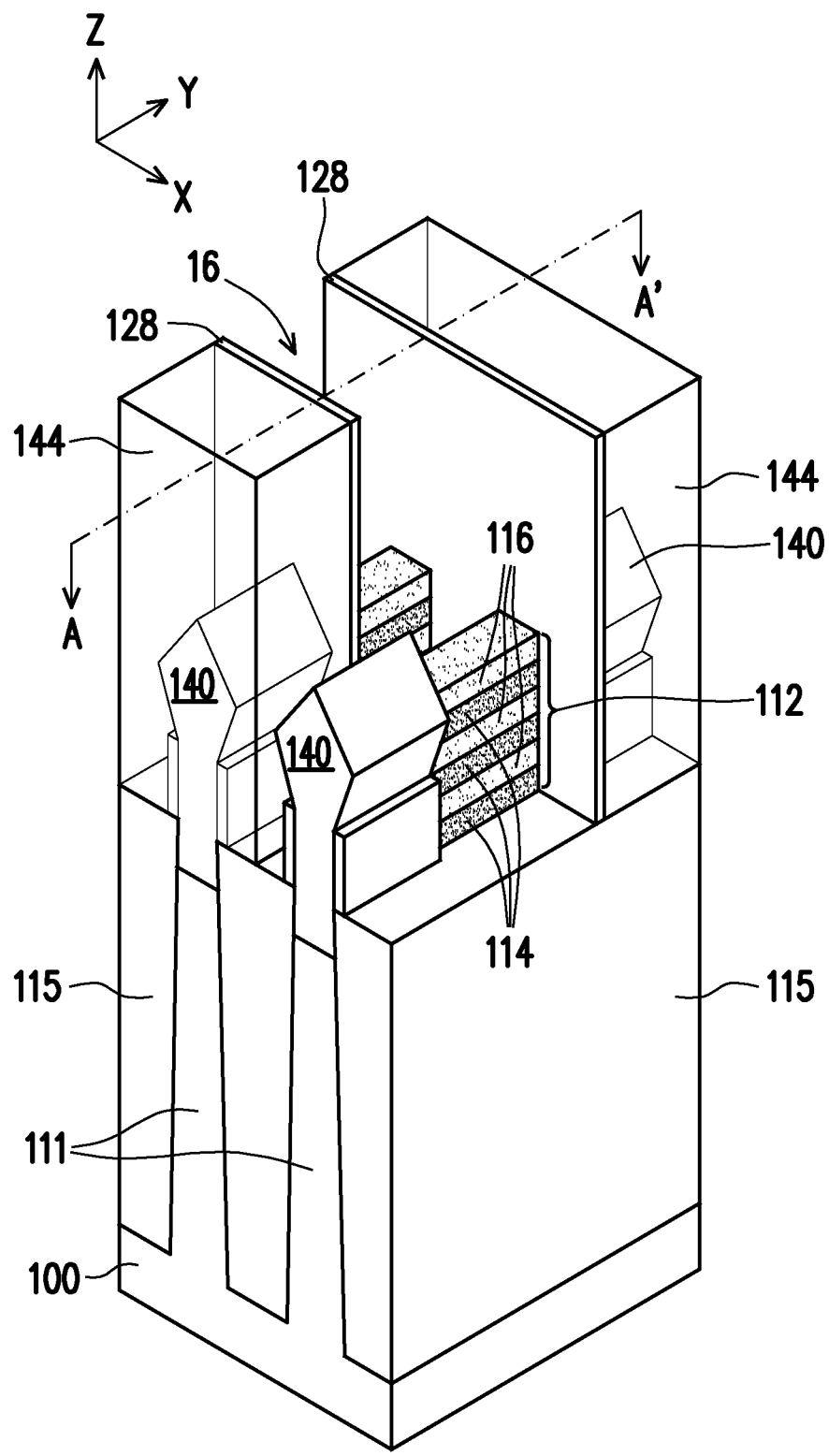
Figure 19:
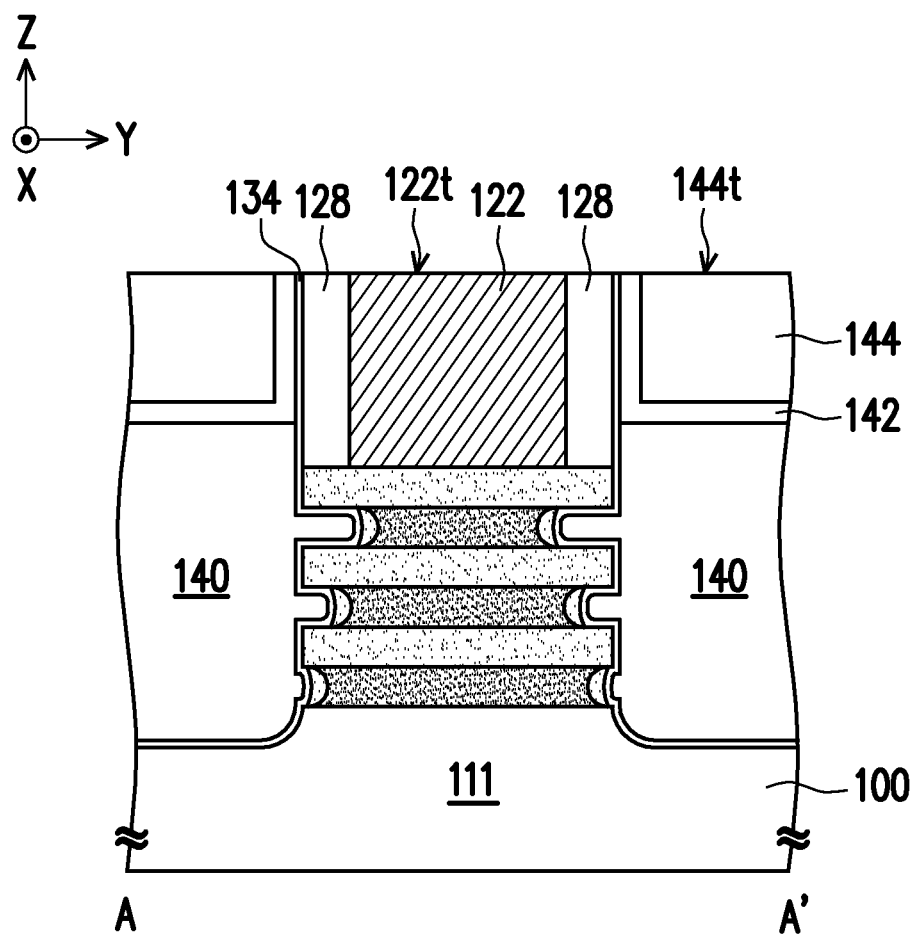
FIGS. 19, 20, 21, 22, and 23 are corresponding fragmentary cross-sectional views of a semiconductor device in FIG. 9 to FIG. 12 taken along the line A-A' in accordance with some embodiments of the disclosure.

Referring to FIG. 9 and FIG. 19, a contact etch stop layer (CESL) 142 over the S/D regions 140 and an interlayer dielectric (ILD) layer 144 over the CESL 142. In some embodiments, the CESL 142 conformally covers the S/D regions 140 and the sidewalls of the outer sidewall 128s of the spacers 128. For clarity, the CESL 142 is not illustrated in perspective views of FIG. 9. The CESL 142 may include silicon nitride, silicon oxynitride, silicon nitride with oxygen (O) or carbon (C) elements, and/or other materials; and may be formed by CVD, PVD (physical vapor deposition), ALD, or other suitable methods.

In addition, in order to illustrate the features behind the front portion of the ILD layer 144, some front portions of the ILD layer 144 are not shown in FIG. 9 and subsequent figures, so that the inner features may be illustrated. It is appreciated that the un-illustrated portions of the ILD layer 144 still exist. In some embodiments, the ILD layer 144 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 144 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 144 include one or more dielectric materials and/or one or more dielectric layers. In some embodiments, the ILD layer 144 is formed to a suitable thickness by FCVD, CVD, HDPCVD, SACVD, spin-on, sputtering, or other suitable methods. For example, an interlayer dielectric material layer (not shown) is initially formed to cover the isolation regions 115, the dummy gate stack 122, and the spacers 128. Subsequently, a thickness of the interlayer dielectric material layer is reduced until the dummy gate stack 122 is exposed, so as to form the ILD layer 144. In the case, the liner layer 134 on the top surface of the dummy gate stack 122 is also removed. The process of reducing the thickness of the interlayer dielectric material layer may be achieved by a chemical mechanical polishing (CMP) process, an etching process, or other suitable processes. In the case, the top surface 144t of the ILD layer 144 may be coplanar with the top surface 122t of the dummy gate stack 122.

Figure 20:
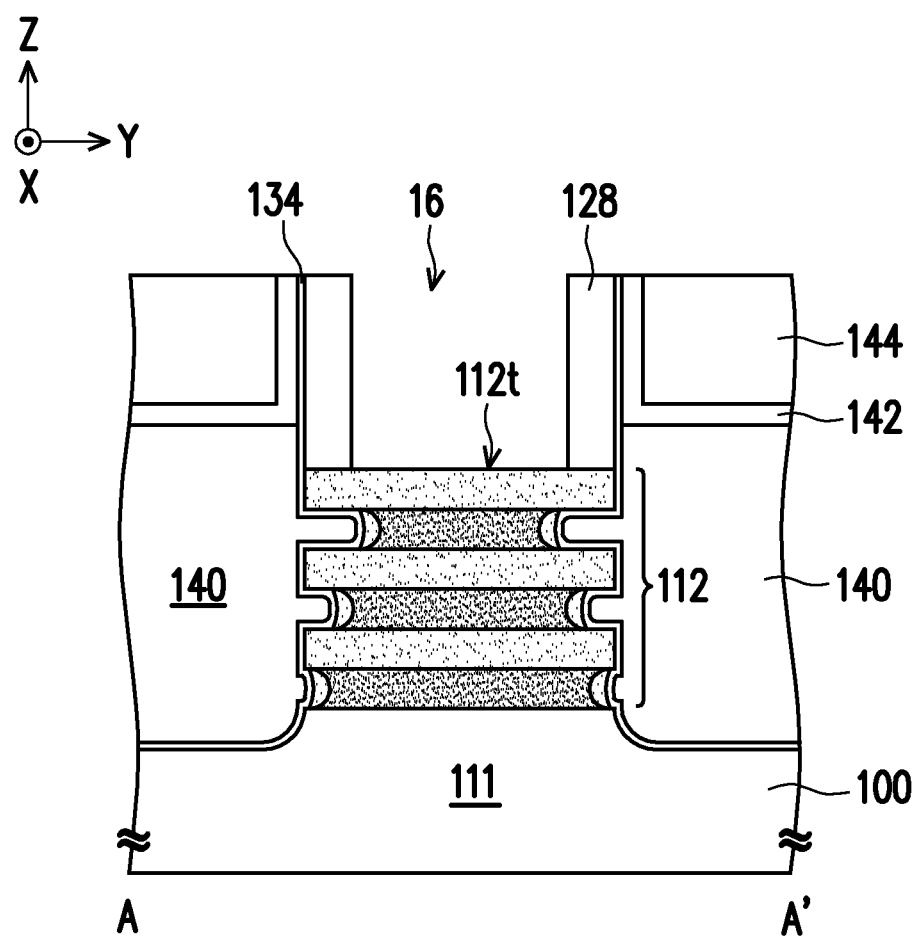

Referring to FIG. 9 and FIG. 20, the dummy gate stack 122 is removed to form a gate trench 16. The ILD layer 144 and the CESL 142 may protect the S/D regions 140 during removing the dummy gate stack 122. The dummy gate stack 122 may be removed by using plasma dry etching and/or wet etching. When the dummy gate electrode is polysilicon and the ILD layer 144 is silicon oxide, a wet etchant such as a TMAH solution may be used to selectively remove the dummy gate electrode. The dummy gate dielectric layer is thereafter removed by using another plasma dry etching and/or wet etching.

Figure 10A:
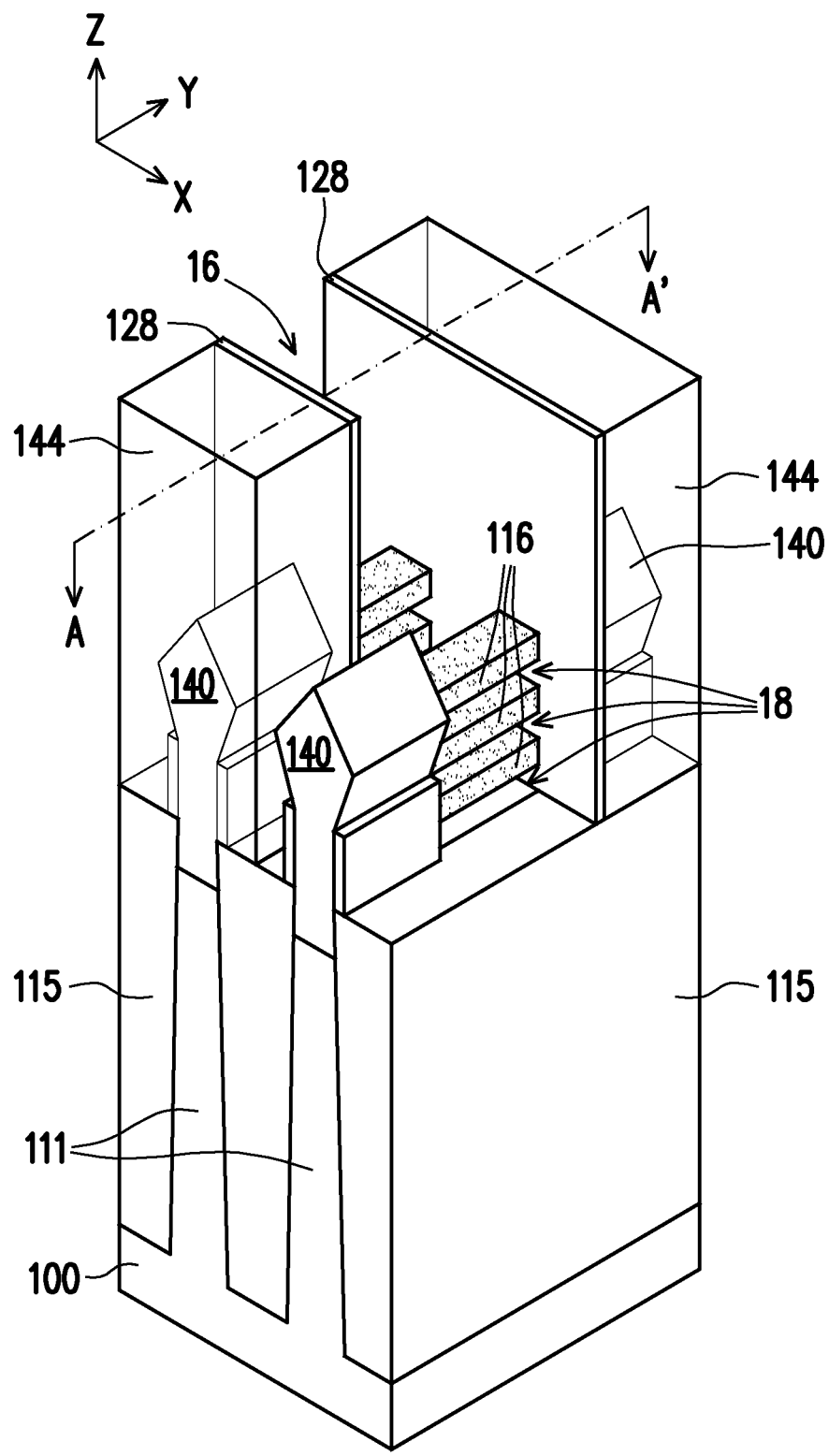
Figure 21:
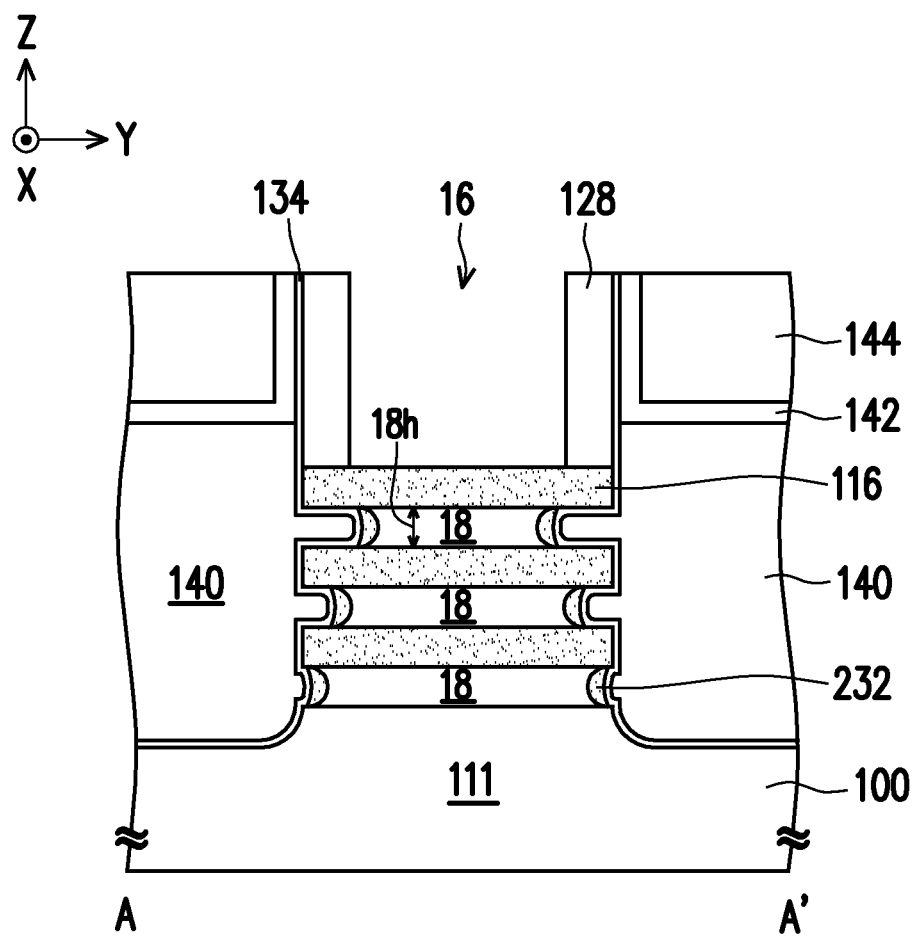

Referring to FIG. 10A and FIG. 21, an etching process is performed to remove the first nanosheets 114. In the case, the first nanosheets 114 may be completely removed to form a plurality of gaps 18 between the second nanosheets 116, as shown in FIG. 21. Accordingly, the second nanosheets 116 are separated from each other by the gaps 18. In addition, the bottommost second nanosheet 116 may also be separated from the fin 111 by the gaps 18. As a result, the second nanosheets 116 are suspended. The opposite ends of the suspended second nanosheets 116 are connected to S/D regions 140. Herein, the suspended second nanosheets 116 may be referred to as channel members 116. It should be noted that the inner spacers 232 and portions of the liner layer 134 abutting the inner spacers 232 may be referred to as a barrier for protecting the S/D regions 140 during the etching process. In some embodiments, since the inner spacer 232 has the thinner edge thickness 232t2 (in FIG. 16F), the etchant used in the etching process may etch through the thinner edge thickness 232t2 to damage the S/D regions 140. The portions of the liner layer 134 abutting the inner spacers 232 may increase the etching resistance to protect the S/D regions 140 from damaging. Herein the etching process may be referred to as nanosheet formation or releasing nanosheet process.

In some embodiments, a height 18h of the gaps 18 may be 5 nm to 30 nm. In the present embodiment, the second nanosheets 116 include silicon, and the first nanosheets 114 include silicon germanium. The first nanosheets 114 may be selectively removed by oxidizing the first nanosheets 114 using a suitable oxidizer, such as ozone. Thereafter, the oxidized first nanosheets 114 may be selectively removed from the gate trench 16. In some embodiments, the etching process includes a dry etching process to selectively remove the first nanosheets 114, for example, by applying an HCl gas at a temperature of about 20° C. to about 300° C., or applying a gas mixture of $CF_4$, $SF_6$, and $CHF_3$. Herein, as shown in FIG. 21, vertically stacked nanosheets 116 may be referred to as semiconductor nanosheet stacks or channel stack of the n-type and/or p-type semiconductor device, alternatively.

Figure 10B:
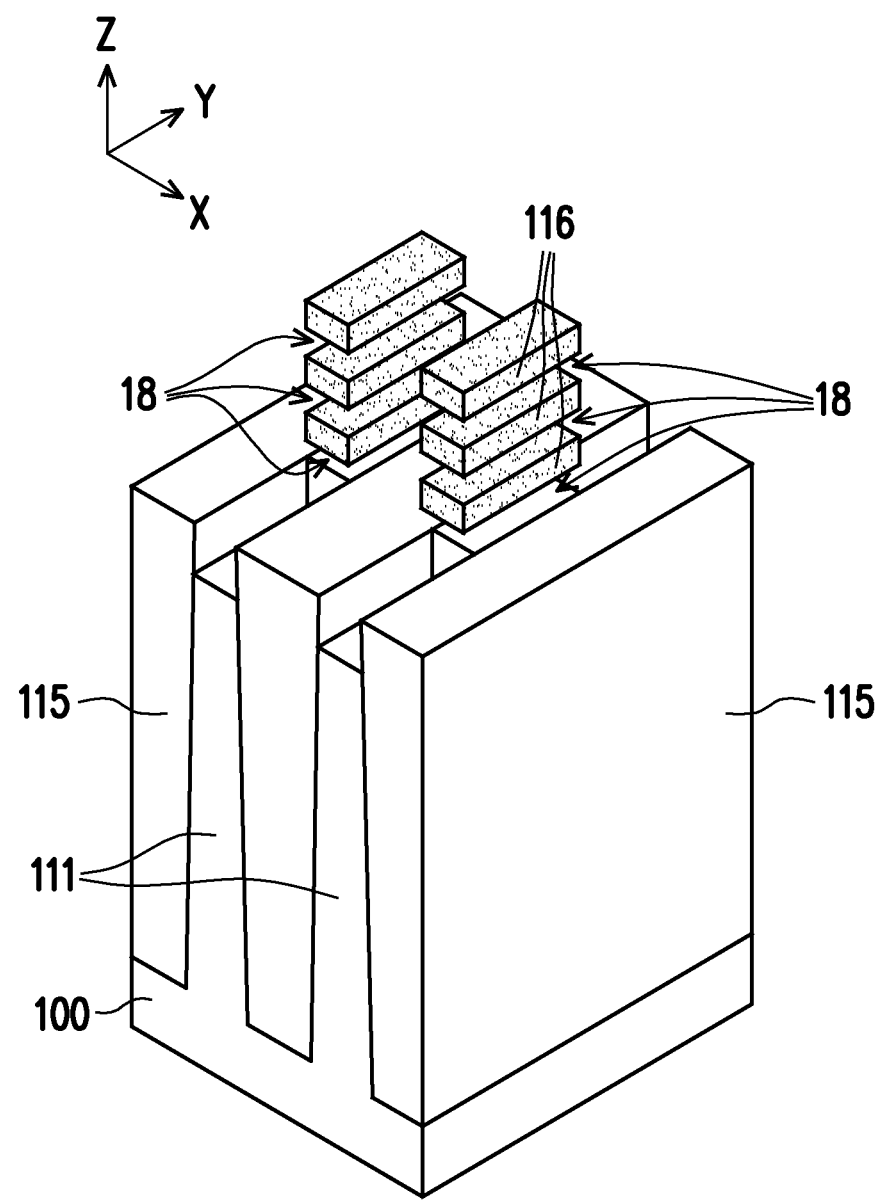

FIG. 10B illustrates a clearer view of the portions of stacked nanosheets 116. The ILD 144, the S/D regions 140, and the spacers 128 as shown in FIG. 10A are not shown in FIG. 10B, although these features still exist.

Figure 11A:
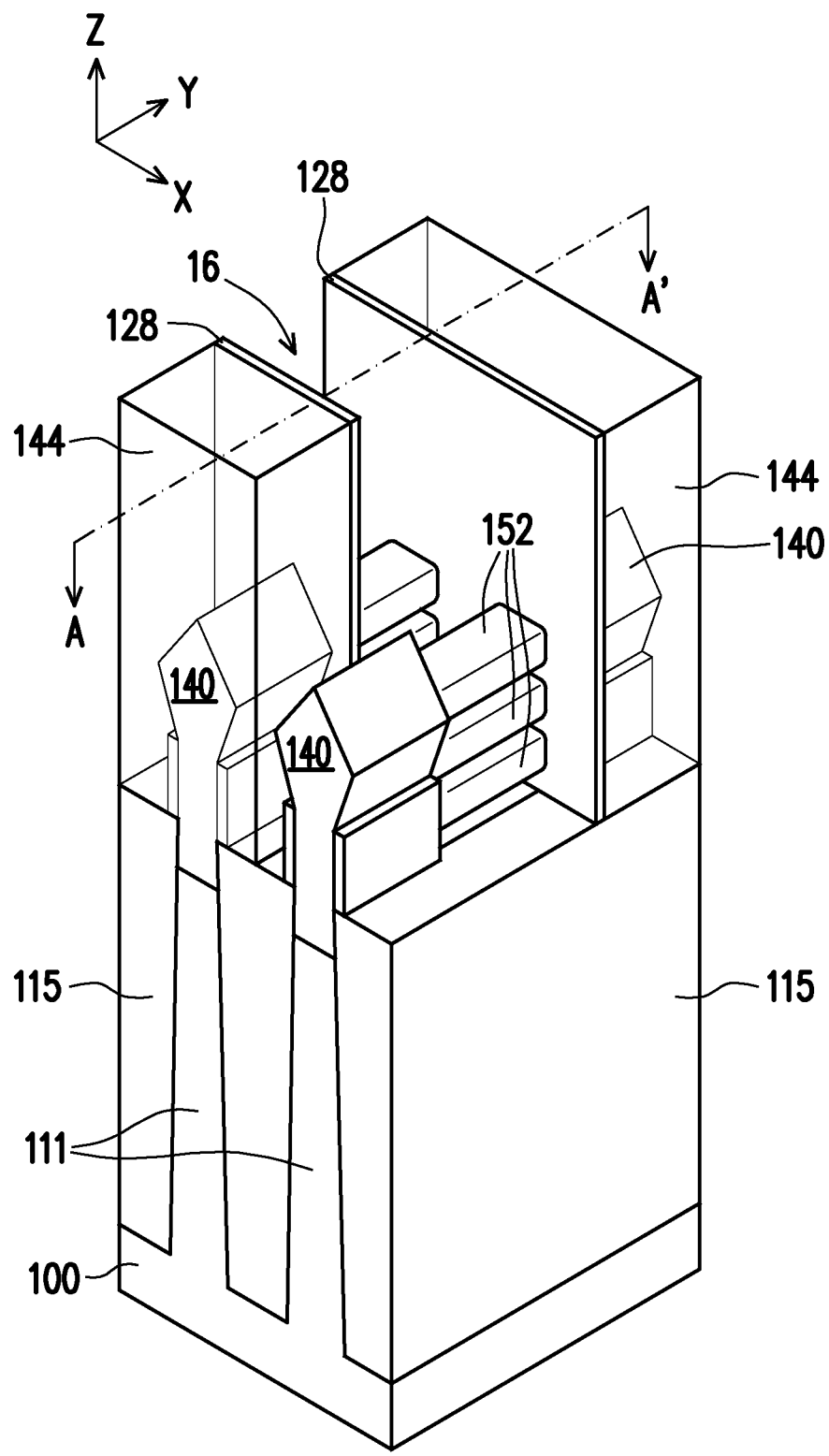
Figure 11B:
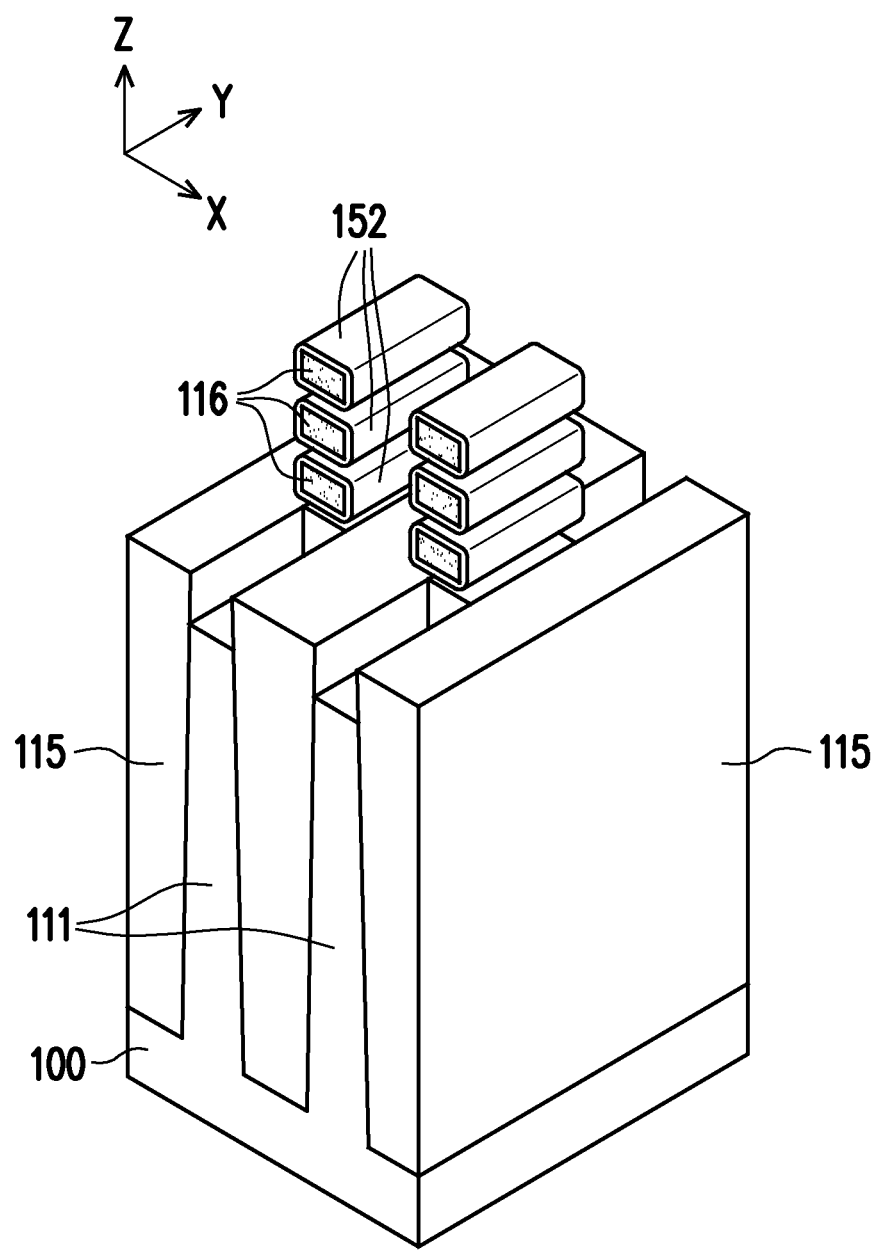
Figure 22:
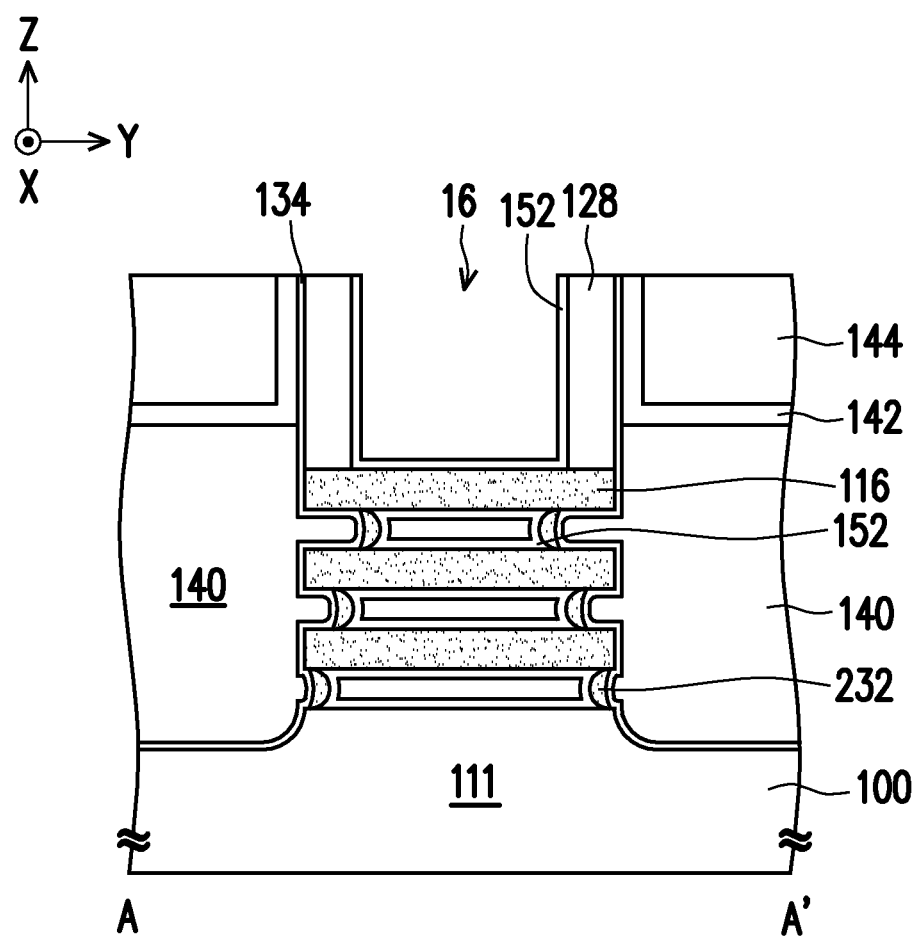

Referring to FIG. 11A and FIG. 22, a gate dielectric layer 152 is formed in the gate trench 16 and the gaps 18. FIG. 11B illustrates a clearer view of the gate dielectric layer 152 wrapping the second nanosheets 116. In addition, the gate dielectric layer 152 conformally covers the gate trench 16 to form a U-shape cross-section, as shown in FIG. 22. In some embodiments, the gate dielectric layer 152 includes one or more layers of a dielectric material, such as silicon oxide, silicon nitride, or high-k dielectric material, other suitable dielectric material, and/or combinations thereof. Examples of high-k dielectric material include $HfO2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 152 includes an interfacial layer (not shown) formed between the channel members and the dielectric material. The gate dielectric layer 152 may be formed by CVD, ALD or any suitable method. In one embodiment, the gate dielectric layer 152 is formed by using a highly conformal deposition process, such as ALD in order to ensure the formation of a gate dielectric layer having a uniform thickness around each channel members. A thickness of the gate dielectric layer 152 is in a range from about 0.5 nm to about 3 nm in some embodiments.

Figure 12:
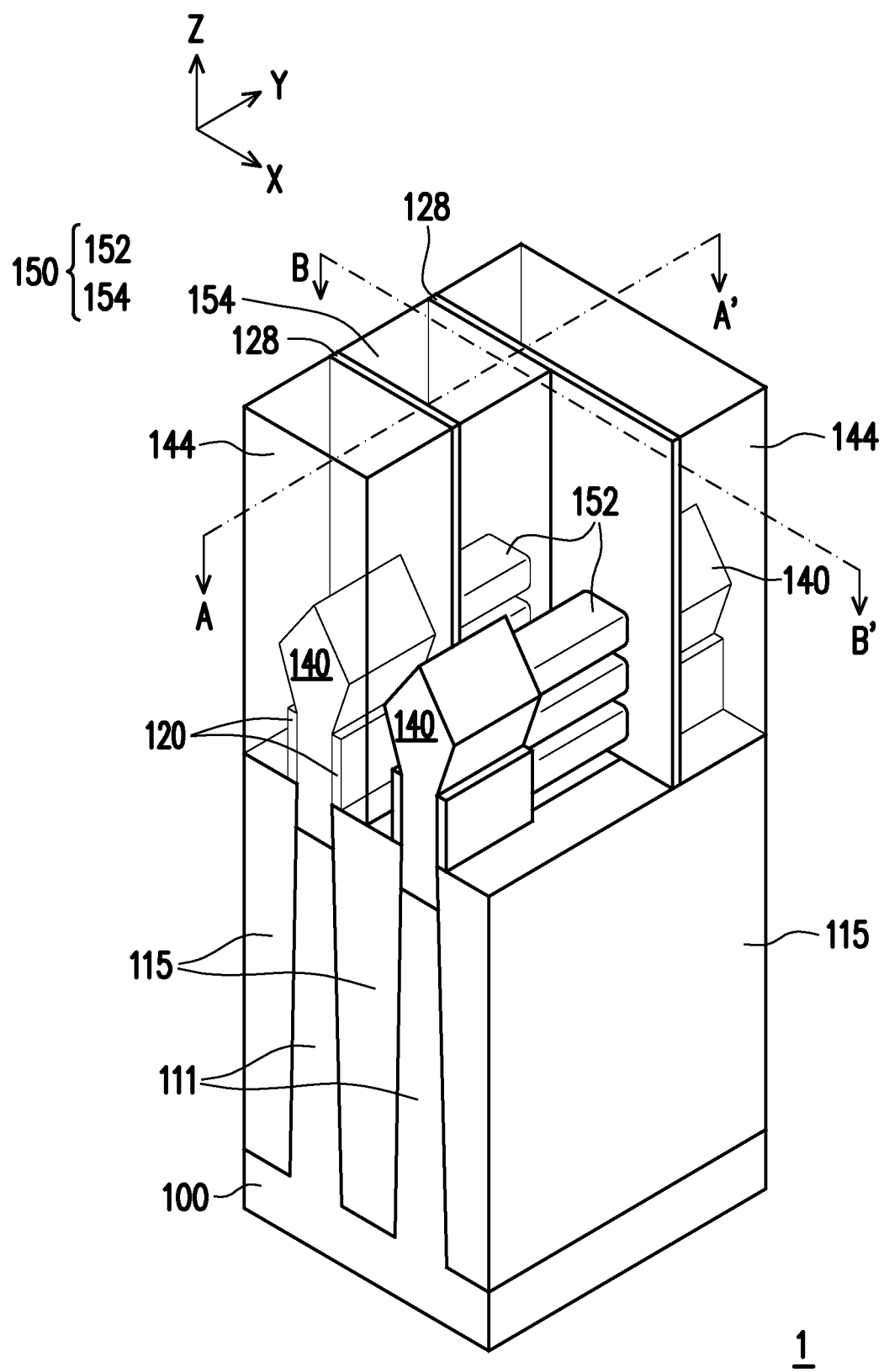
Figure 23:
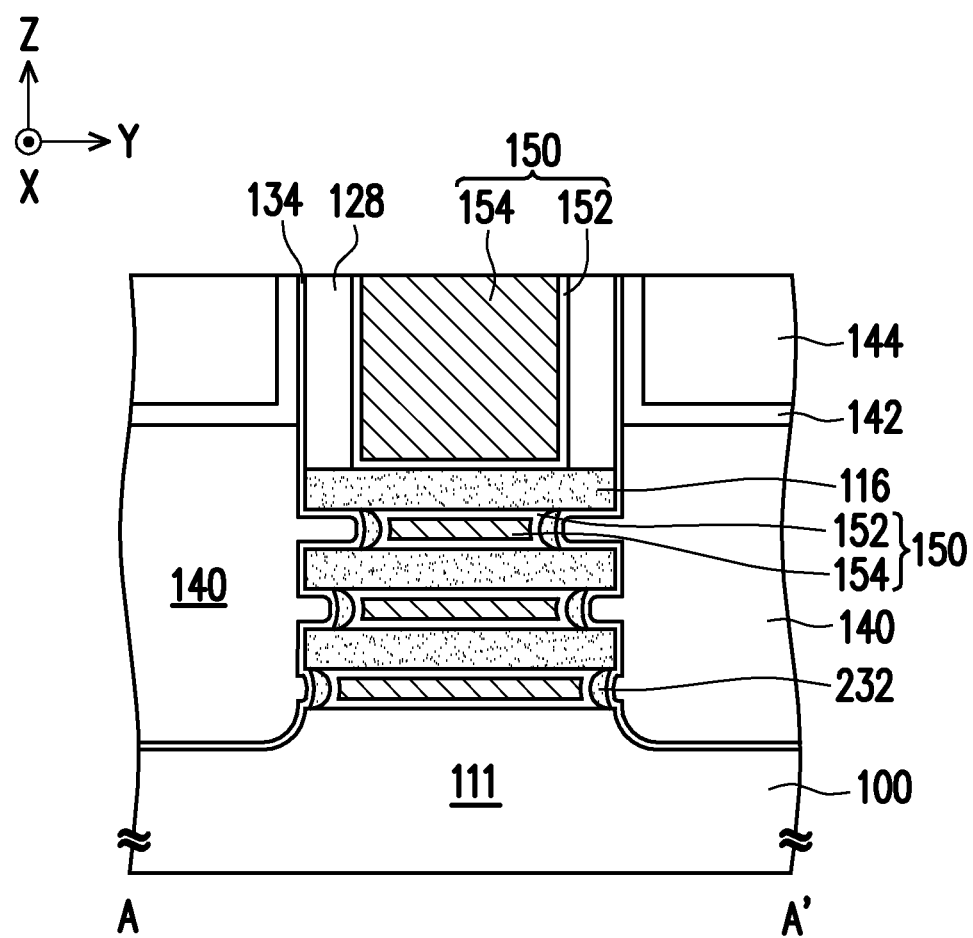

Referring to FIG. 12A and FIG. 23, a gate electrode 154 is formed on the gate dielectric layer 152 to surround each nanosheet or channel member 116. In the case, the gate electrode 154 and the gate dielectric layer 152 constitute a gate stack 150, and a semiconductor device 1 of the first embodiment is accomplished, as shown in FIG. 12. In the present embodiment, the liner layer 134 lines the bottom surfaces and the sidewalls of the S/D regions 140 and is sandwiched between the S/D regions 140 and the gate stack 150. The liner layer 134 further extends between the S/D regions 140 and the nanosheets 116 to separate the S/D regions 140 from the nanosheets 116. The liner layer 134 is benefit for epitaxially growing the S/D regions 140. In addition, the liner layer 134 also strengthen the blocking effect of the inner spacers 232 with crescent shape during the nanosheet formation or the releasing nanosheet process. Further, the combination of the liner layer 134 and the inner spacers 232 further avoids doping diffusion between the S/D regions 140 and the gate stack 150, thereby improving the performance of the semiconductor device 1.

The gate electrode 154 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 154 may be formed by CVD, ALD, electro-plating, or other suitable method. The gate dielectric layer 152 and the gate electrode 154 may also be deposited over the upper surfaces of the ILD layer 144 and the CESL 142. The gate dielectric layer 152 and the gate electrode 154 formed over the ILD layer 144 and the CESL 142 are then planarized by using, for example, CMP, until the top surfaces of the ILD layer 144 and the CESL 142 are revealed. In some embodiments, after the planarization operation, the gate electrode 154 is recessed and a cap insulating layer (not shown) is formed over the recessed gate electrode 154. The cap insulating layer includes one or more layers of a silicon nitride-based material, such as SiN. The cap insulating layer may be formed by depositing an insulating material followed by a planarization operation.

In some alternative embodiments, one or more work function adjustment layers (not shown) are interposed between the gate dielectric layer 152 and the gate electrode 154. The work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For the n-type device, one or more of TaN, TaAlC, TiN, TiC, Co, TiAl, HfTi, TiSi and TaSi is used as the work function adjustment layer, and for the p-type device, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-type device and the p-type device which may use different metal layers.

Figure 24A:
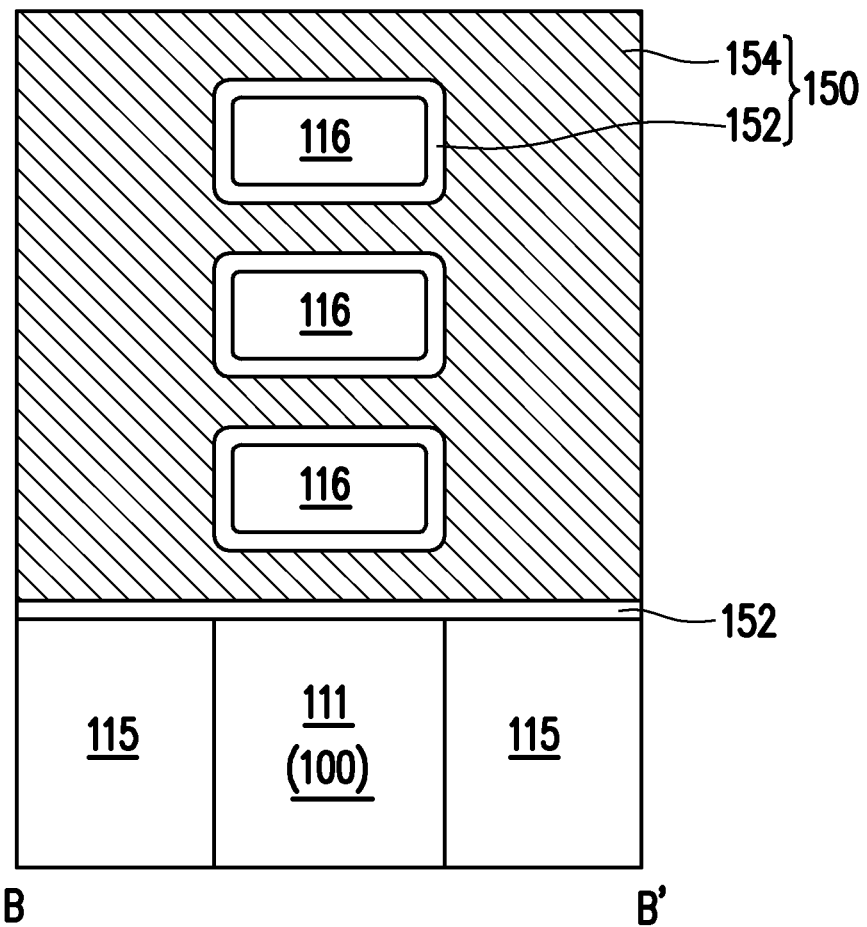
FIG. 24A to FIG. 24D are corresponding fragmentary cross-sectional views of a semiconductor device in FIG. 12 taken along the line B-B' in accordance with various embodiments of the disclosure.
Figure 24B:
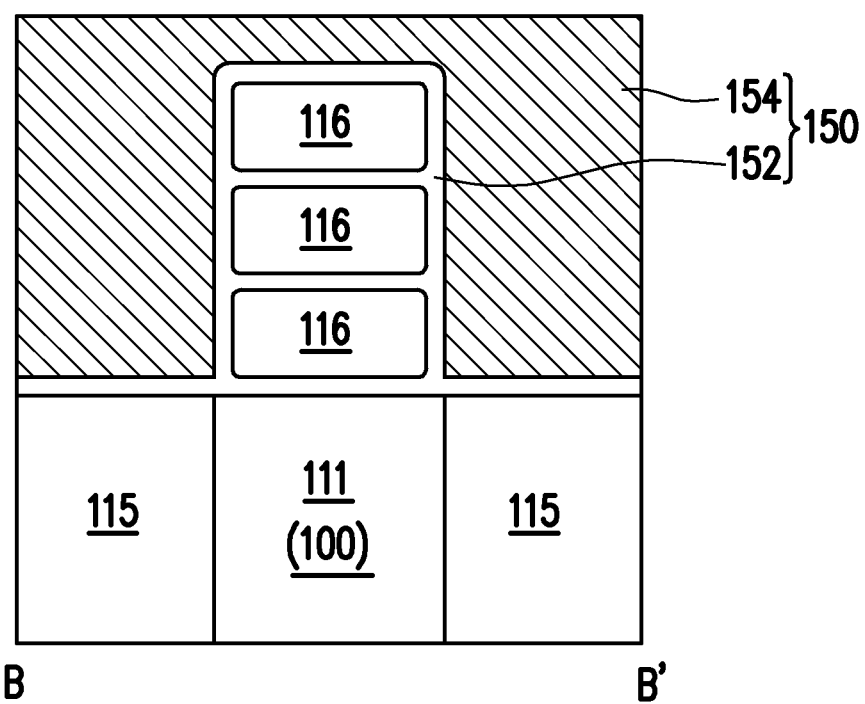
Figure 24C:
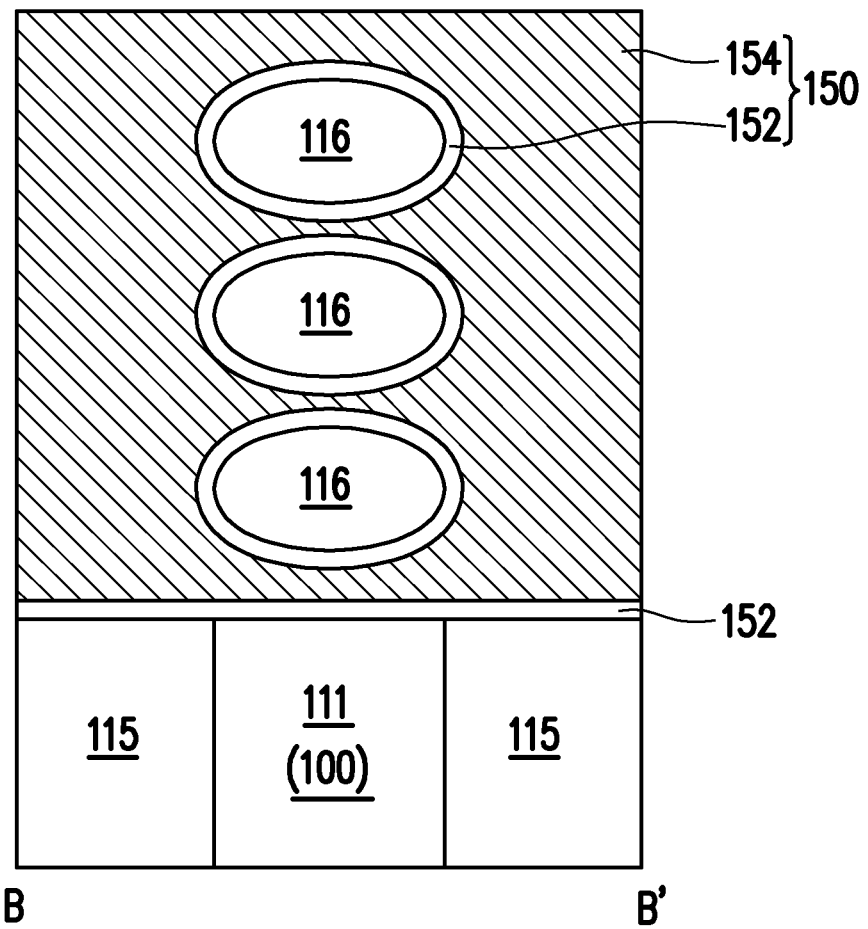
Figure 24D:
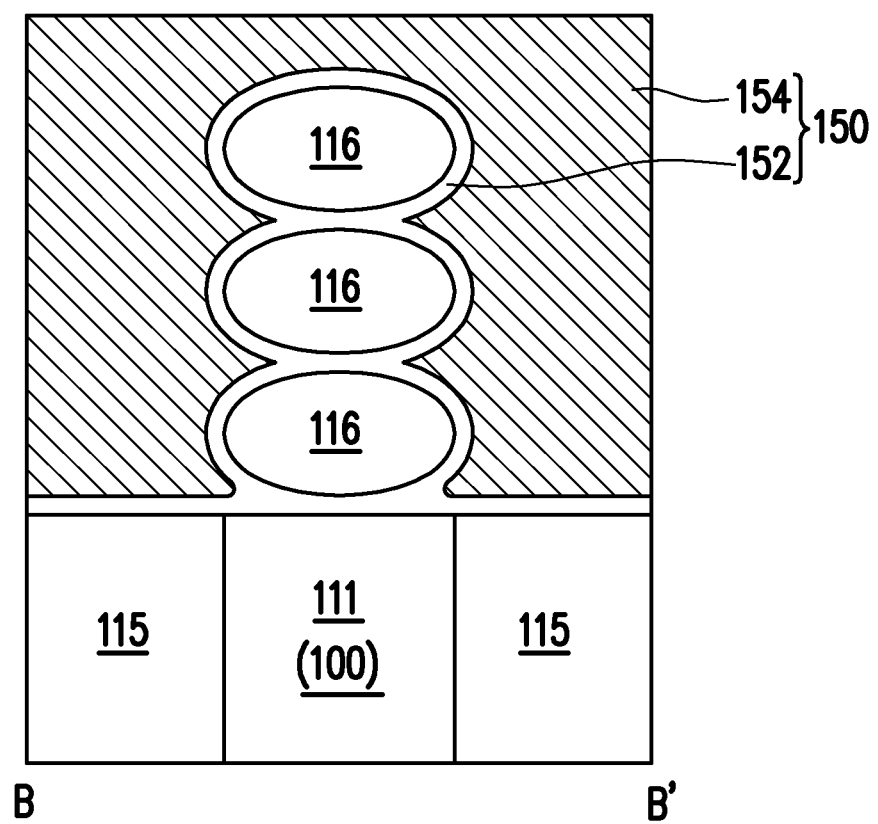

FIG. 24A shows a cross-sectional view along the line B-B' of the semiconductor device 1 in FIG. 12. In the embodiment, the gate dielectric layer 152 wraps the second nanosheets 116 (hereinafter called channel members 116). In some embodiments, one of the channel members 116 has rounded corners, a flat top surface connecting two adjacent rounded corners, and a flat bottom surface connecting other adjacent rounded corners. The gate dielectric layer 152 wrapping the corresponding channel member 116 also has rounded corners, a flat top surface, and a flat bottom surface. The gate electrode 154 is sandwiched between adjacent channel members 116 to separate the gate dielectric layers 152 from each other, as shown in FIG. 24A. However, the embodiment of the disclosure is not limited thereto, in other embodiments, portions of the gate dielectric layer 154 wrapping the channel members 116 are connected together to form a continuous region. In the case, as shown in FIG. 24B, the gate electrode 154 will not be filled into the gaps between the channel members 116. Although the channel members 116 in cross-section illustrated in FIG. 24A and FIG. 24B are rectangle-like shape, the embodiment of the disclosure is not limited thereto. In some alternative embodiments, as shown in FIG. 24C and FIG. 24D, the channel members 116 in cross-section may be circular shape, elliptical shape, or the like.

Figure 25:
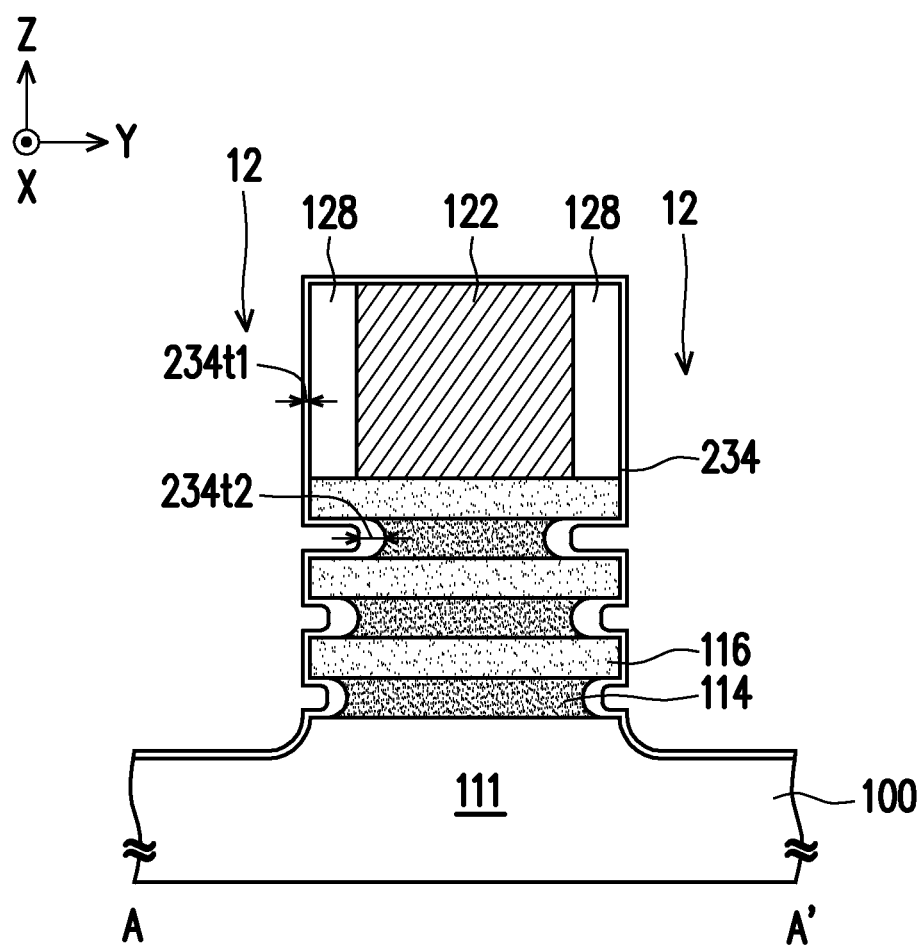
FIG. 25 to FIG. 27 are cross-sectional views of intermediate stages in the formation of a semiconductor device in accordance with a second embodiment of the disclosure.
Figure 26:
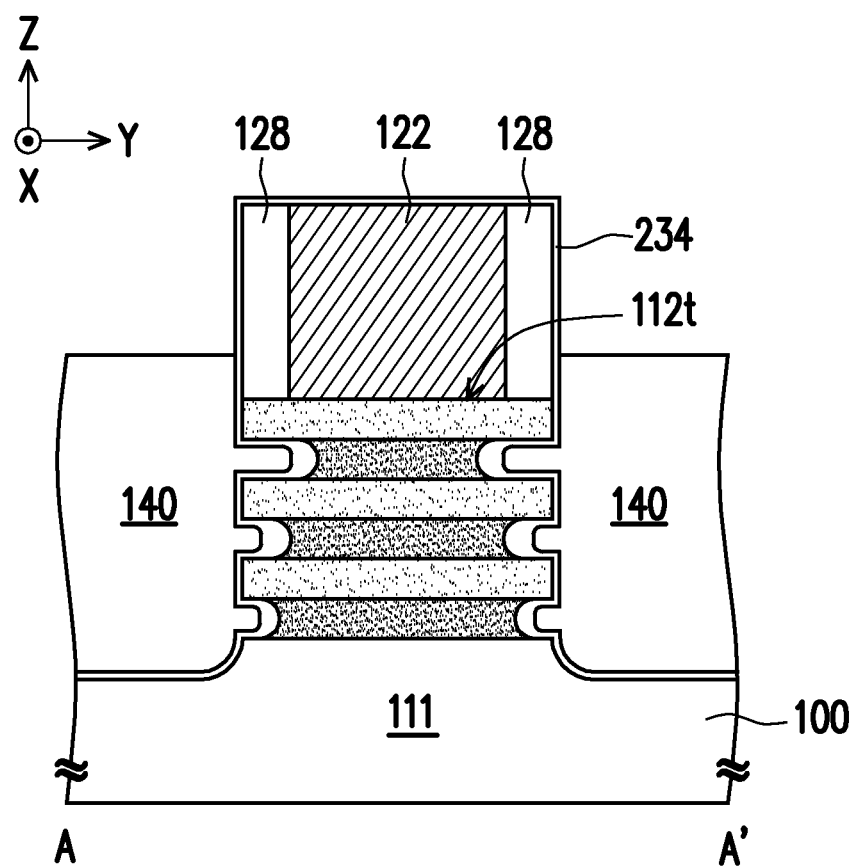
Figure 27:
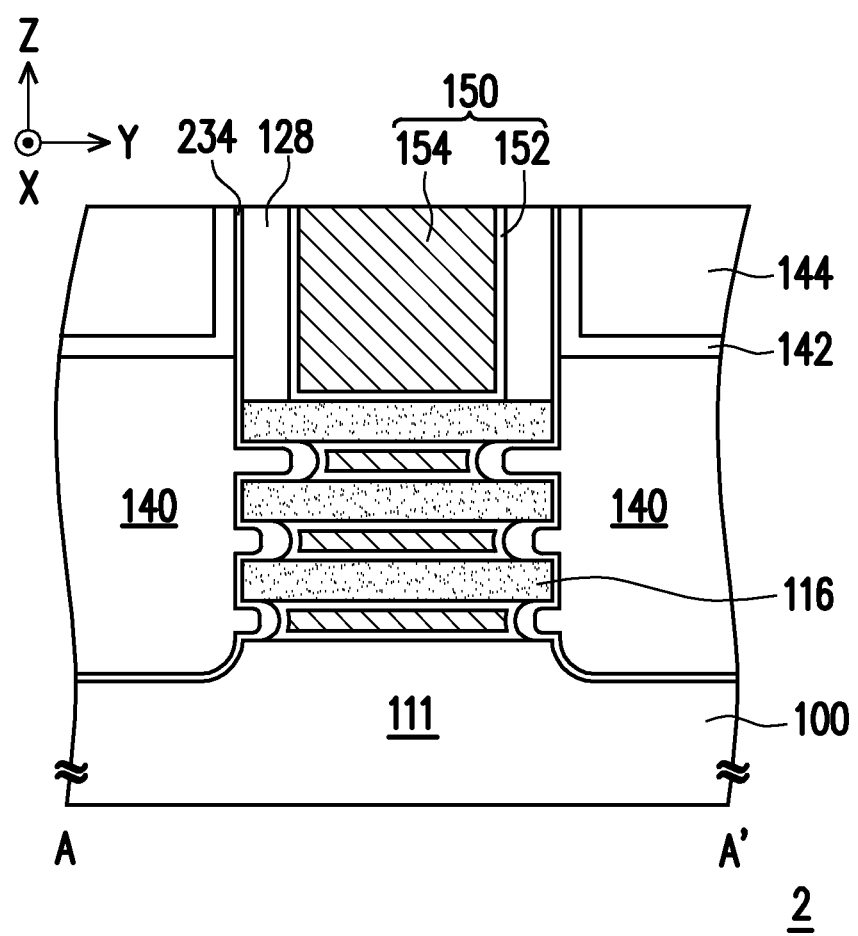

FIG. 25 to FIG. 27 are cross-sectional views of intermediate stages in the formation of a semiconductor device in accordance with a second embodiment of the disclosure.

FIG. 25 illustrates a structure following the structure in FIG. 14C. Next, a liner layer 234 may be formed on the substrate 100. In some embodiments, the liner layer 234 conformally covers the S/D recesses 12 and the cavities 14. The liner layer 234 may be polysilicon layer, a Ge layer, a SiGe layer, the like, or a combination thereof, and may be formed by ALD. In some embodiments, the liner layer 234 has a first portion on the dummy gate stack 122 (or spacers 128) and a second portion in the cavities 14. The first portion has a first thickness 234$t$1 and the second portion has a second thickness 234$t$2. The second thickness 234$t$2 is greater than the first thickness 234$t$1. It should be noted that the thicker second thickness 234$t$2 in the cavities 14 is able to block the etchant used in the subsequent nanosheet formation or releasing nanosheet process.

FIG. 26 illustrates the S/D regions (or strained material) 140 epitaxially grown from the liner layer 134. In some embodiments, the S/D regions 140 fully fills in the cavities 14 and extends beyond the top surface 112$t$ of the nanosheet stacks 112. The material and forming method of the S/D regions 140 have been described in detail in the above embodiments. Thus, details thereof are omitted here. In addition, the liner layer 234 conformally and continuously covering the cavities 14 may provide a good interface for epitaxially growing the S/D regions 140 which is benefit to control the height and shape of the S/D regions 140, thereby reducing void defects and retaining strain in the channels.

FIG. 26 and FIG. 27 illustrate a sequence steps corresponding to FIG. 19 to FIG. 23. After forming the S/D regions 140, the CESL 142 is formed on the S/D regions 140 and the ILD layer 144 is formed on the CESL 142. The dummy gate stack 122 is then removed to form the gate trench. Thereafter, the first nanosheets 114 is completely removed to release the second nanosheets 116 and form the gaps between the second nanosheets 116. The gate stack 150 is formed in the gate trench and the gaps. The gate stack 150 may include the gate dielectric layer 152 wrapping the second nanosheets 116 and the gate electrode 154 covering the gate dielectric layer 152. After forming the gate stack 150, a semiconductor device of the second embodiment is accomplished, as shown in FIG. 27.

According to some embodiments, the semiconductor device includes a substrate, a plurality of semiconductor nanosheets, a source/drain (S/D) region, a gate stack, and a liner layer. The substrate includes at least one fin. The plurality of semiconductor nanosheets are stacked on the at least one fin. The S/D region abuts the plurality of semiconductor nanosheets. The gate stack wraps the plurality of semiconductor nanosheets. The liner layer lines a bottom surface and a sidewall of the S/D region and is sandwiched between the S/D region and the gate stack.

According to some embodiments, a method of forming a semiconductor device includes: forming a semiconductor stack on a substrate, wherein the semiconductor stack comprises a plurality of first layers and a plurality of second layers stacked alternately; patterning the semiconductor stack and the substrate to form a plurality of trenches in the substrate and a stack of semiconductor strips between the plurality of trenches; forming a dummy gate stack across the at least one stack of semiconductor strips; removing a portion of the stack of semiconductor strips at opposite sides of the dummy gate stack to form source/drain (S/D) recesses exposing the substrate; laterally recessing the plurality of first layers to form a plurality of cavities; forming a liner layer to cover the S/D recesses and the plurality of cavities; and epitaxially growing S/D regions from the liner layer.

According to some embodiments, a method of forming a semiconductor device includes: forming a nanosheet stack on at least one fin, wherein the nanosheet stack comprises a plurality of Si nanosheets and a plurality of SiGe nanosheets disposed alternately; laterally recessing the plurality of SiGe nanosheets to form a plurality of cavities; forming a plurality of inner spacers in the plurality of cavities respectively; forming a liner layer to cover outer sidewalls of the plurality of inner spacers; epitaxially growing S/D regions from the liner layer; removing the plurality of SiGe nanosheets to form a plurality of gaps between the plurality of the Si nanosheets; and forming a gate stack wrapping the plurality of the Si nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming at least one stack of semiconductor strip on a substrate, wherein the at least one stack of semiconductor strip comprises a plurality of first layers and a plurality of second layers stacked alternately;
   forming a dummy gate stack across the at least one stack of semiconductor strips;
   removing a portion of the at least one stack of semiconductor strip at opposite sides of the dummy gate stack to form source/drain (S/D) recesses exposing the substrate;
   laterally recessing the plurality of first layers to form a plurality of first cavities;
   forming a liner layer to cover the S/D recesses and the plurality of first cavities by using an atomic layer deposition (ALD), wherein the liner layer has an inner sidewall adjacent to the plurality of first layers and an outer sidewall opposite the inner sidewall, and the outer sidewall is concave into the plurality of first cavities to form a plurality of second cavities between adjacent second layers; and
   epitaxially growing S/D regions from the liner layer.

2. The method of claim 1, wherein the S/D regions have a plurality of protrusions respectively filling into the plurality of second cavities, and the plurality of protrusions are vertically sandwiched between the plurality of second layers.

3. The method of claim 1, wherein depths of the plurality of second cavities gradually increase along a direction from the substrate to the dummy gate stack.

4. The method of claim 1, further comprising:
   removing the dummy gate stack;
   performing an etching process to remove the plurality of first layers and form a plurality of gaps between the plurality of the second layers;
   forming a gate dielectric layer wrapping the plurality of the second layers; and
   forming a gate electrode to cover the gate dielectric layer.

5. The method of claim 4, wherein the plurality of first layers and the plurality of second layers have different etching selectivities in the etching process.

6. The method of claim 1, further comprising forming a plurality of inner spacers in the plurality of first cavities respectively after laterally recessing the plurality of first layers, wherein the plurality of inner spacers are sandwiched between the liner layer and the plurality of first layers.

7. The method of claim 6, wherein outer sidewalls of the plurality of inner spacers are concave from sidewalls of the plurality of second layers.

8. The method of claim 6, wherein the liner layer continuously vertically extends between the adjacent second layers to conformally cover the plurality of first cavities and completely cover outer sidewalls of the plurality of inner spacers.

9. A method of forming a semiconductor device, comprising:
   forming a nanosheet stack on at least one fin, wherein the nanosheet stack comprises a plurality of Si nanosheets and a plurality of SiGe nanosheets disposed alternately;
   laterally recessing the plurality of SiGe nanosheets to form a plurality of first cavities;
   forming a plurality of inner spacers in the plurality of first cavities respectively;
   forming a liner layer to cover outer sidewalls of the plurality of inner spacers and the plurality of first cavities, wherein the liner layer has an inner sidewall adjacent to the outer sidewalls of the plurality of inner spacers and an outer sidewall opposite the inner sidewall, and the outer sidewall of the liner layer is concaved to form a plurality of second cavities between adjacent Si nanosheets;
   epitaxially growing S/D regions from the liner layer;
   removing the plurality of SiGe nanosheets to form a plurality of gaps between the plurality of the Si nanosheets; and
   forming a gate stack wrapping the plurality of the Si nanosheets.

10. The method of claim 9, wherein the removing the plurality of SiGe nanosheets comprises using the liner layer and the plurality of inner spacers as a barrier, and the liner layer and the plurality of inner spacers has an etching rate less than an etching rate of the plurality of SiGe nanosheets.

11. The method of claim 9, wherein the liner layer is a polysilicon layer extending from the plurality of first cavities to cover sidewalls of the plurality of the Si nanosheets.

12. The method of claim 9, wherein the liner layer is formed by an atomic layer deposition (ALD).

13. The method of claim 9, wherein the S/D regions have a plurality of protrusions respectively filling into the plurality of second cavities, and the plurality of protrusions are vertically sandwiched between the plurality of Si nanosheets.

14. The method of claim 9, wherein depths of the plurality of first cavities gradually increase along a stack direction of the nanosheet stack.

15. A method of forming a semiconductor device, comprising:
   forming a nanosheet stack on at least one fin, wherein the nanosheet stack comprises a plurality of Si nanosheets and a plurality of SiGe nanosheets disposed alternately;
   laterally recessing the plurality of SiGe nanosheets to form a plurality of cavities;
   forming a plurality of inner spacers in the plurality of cavities respectively;
   forming a liner layer to cover outer sidewalls of the plurality of inner spacers;
   epitaxially growing S/D regions from the liner layer to form a plurality of protrusions of the S/D regions respectively in the plurality of cavities, wherein one of the plurality of protrusions extends below a bottom surface of a respective Si nanosheet;
   removing the plurality of SiGe nanosheets to form a plurality of gaps between the plurality of the Si nanosheets; and
   forming a gate stack wrapping the plurality of the Si nanosheets.

16. The method of claim 15, wherein the removing the plurality of SiGe nanosheets comprises using the liner layer and the plurality of inner spacers as a barrier, and the liner layer and the plurality of inner spacers has an etching rate less than an etching rate of the plurality of SiGe nanosheets.

17. The method of claim 15, wherein the liner layer is a polysilicon layer extending from the plurality of cavities to cover sidewalls of the plurality of the Si nanosheets.

18. The method of claim 15, wherein the liner layer is formed by an atomic layer deposition (ALD).

19. The method of claim 15, wherein lengths of the plurality of protrusions gradually increase along a stack direction of the nanosheet stack.

20. The method of claim 15, wherein depths of the plurality of cavities gradually increase along a stack direction of the nanosheet stack.

\* \* \* \* \*